(12) United States Patent
Watanabe et al.

(10) Patent No.: US 7,135,270 B2
(45) Date of Patent: Nov. 14, 2006

(54) RESIST POLYMER, RESIST COMPOSITION AND PATTERNING PROCESS

(75) Inventors: Takeru Watanabe, Niigata-ken (JP); Tsunehiro Nishi, Niigata-ken (JP); Junji Tsuchiya, Niigata-ken (JP); Kenji Funatsu, Niigata-ken (JP); Koji Hasegawa, Niigata-ken (JP)

(73) Assignee: Shin-Etsu Chemical Co., Ltd., Tokyo (JP)

(*) Notice: Subject to any disclaimer, the term of this patent is extended or adjusted under 35 U.S.C. 154(b) by 12 days.

(21) Appl. No.: 10/911,676

(22) Filed: Aug. 5, 2004

(65) Prior Publication Data
US 2005/0031989 A1    Feb. 10, 2005

(30) Foreign Application Priority Data
Aug. 7, 2003    (JP)    ............. 2003-288844

(51) Int. Cl.
G03C 1/73     (2006.01)
G03F 7/039    (2006.01)
G03F 7/20     (2006.01)
G03F 7/30     (2006.01)
C08F 124/00   (2006.01)

(52) U.S. Cl. ............ 430/270.1; 430/910; 430/326; 430/330; 430/327; 526/266; 526/268

(58) Field of Classification Search ........... 430/270.1, 430/325, 326, 330, 327, 910; 526/280, 281
See application file for complete search history.

(56) References Cited
U.S. PATENT DOCUMENTS
5,968,713 A    10/1999    Nozaki et al.

(Continued)

FOREIGN PATENT DOCUMENTS
JP    4-39665 A    2/1992

(Continued)

*Primary Examiner*—Sin Lee
(74) *Attorney, Agent, or Firm*—Birch, Stewart, Kolasch & Birch, LLP

(57) ABSTRACT

A polymer comprising recurring units of formulae (1), (2), (3) and (4) increases a dissolution rate in an alkali developer under the action of an acid.

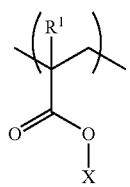

(1)

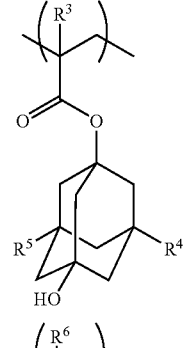

(2)

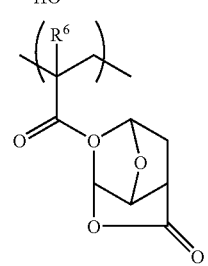

(3)

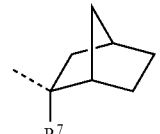

(4)

$R^1$, $R^2$, $R^3$ and $R^6$ are H or $CH_3$, $R^4$ and $R^5$ are H or OH, X is a tertiary exo-alkyl group having a bicyclo[2.2.1]heptane framework, represented by any of formulae (X-1) to (X-4):

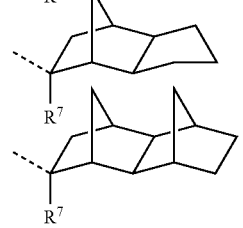

wherein $R^7$ is $C_1$–$C_{10}$ alkyl, and Y is a tertiary alkyl group having an adamantane structure. A resist composition comprising the inventive polymer has a sensitivity to high-energy radiation, improved resolution and minimized proximity bias and lends itself to micropatterning with electron beams or deep UV for VLSI fabrication.

18 Claims, No Drawings

U.S. PATENT DOCUMENTS

| | | |
|---|---|---|
| 6,312,867 B1 | 11/2001 | Kinsho et al. |
| 6,703,183 B1 | 3/2004 | Nishi et al. |
| 2003/0013039 A1* | 1/2003 | Kobayashi et al. ...... 430/270.1 |
| 2003/0054289 A1 | 3/2003 | Nishi et al. |
| 2003/0054290 A1* | 3/2003 | Nishi et al. .............. 430/270.1 |

FOREIGN PATENT DOCUMENTS

| | | |
|---|---|---|
| JP | 9-73173 A | 3/1997 |
| JP | 2000-336121 A | 12/2000 |
| JP | 2003-84438 A | 3/2003 |

* cited by examiner

RESIST POLYMER, RESIST COMPOSITION AND PATTERNING PROCESS

CROSS-REFERENCE TO RELATED APPLICATION

This Nonprovisional application claims priority under 35 U.S.C. §119(a) on Patent Application No. 2003-288844 filed in Japan on Aug. 7, 2003, the entire contents of which are hereby incorporated by reference.

TECHNICAL FIELD

This invention relates to (i) a novel polymer for resist use, (ii) a resist composition comprising the polymer as a base resin for use in the micropatterning technology, and (iii) a patterning process using the resist composition.

BACKGROUND OF THE INVENTION

While a number of recent efforts are being made to achieve a finer pattern rule in the drive for higher integration and operating speeds in LSI devices, deep-ultraviolet lithography is thought to hold particular promise as the next generation in microfabrication technology. In particular, photolithography using a KrF or ArF excimer laser as the light source is strongly desired to reach the practical level as the micropatterning technique capable of achieving a feature size of 0.3 μm or less.

The chemically amplified resist materials for use in photolithography using light of an excimer laser, especially ArF excimer laser having a wavelength of 193 nm, are, of course, required to have a high transparency to light of that wavelength. In addition, they are required to have an etching resistance sufficient to allow for film thickness reduction, a high sensitivity sufficient to eliminate any extra burden on the expensive optical material, and especially, a high resolution sufficient to form a precise micropattern. To meet these requirements, it is crucial to develop a base resin having a high transparency, rigidity and reactivity. Active efforts have been made to develop such base resins. In addition to these requirements, to minimize a difference in pattern size depending on pattern density (proximity bias) becomes an important task for the current technology.

Known high transparency resins include copolymers of acrylic or methacrylic acid derivatives (see JP-A 4-039665). These copolymers are relatively easy to increase reactivity in that highly reactive monomers can be introduced and acid labile units can be increased as desired. They can also be increased in rigidity by introducing alicyclic groups into acid labile units. Various structures which have been proposed as the alicyclic acid-labile groups to be introduced include alkyl groups with adamantane structure (see JP-A 9-073173), tertiary exo-alkyl groups with bicyclo[2.2.1]heptane framework (see JP-A 12-336121), and mixtures thereof (see JP-A 15-084438). They have reached an acceptable level in satisfying both resolution and etching resistance. However, a further improvement in proximity bias is desired.

SUMMARY OF THE INVENTION

An object of the invention is to provide a novel polymer for use in the formulation of a resist composition which has etching resistance and satisfies both a high resolution and a minimized proximity bias when processed by photolithography using light with a wavelength of up to 300 nm, especially ArF excimer laser light as the light source. Another object of the invention is to provide a resist composition comprising the polymer as a base resin, and a patterning process.

The inventor has found that a resist composition comprising as a base resin a polymer comprising recurring units of the general formulae (1), (2), (3) and (4), shown below, has good etching resistance and satisfies both a high resolution and a minimized proximity bias. The recurring units of formulae (1), (2) and (3) greatly contribute to etching resistance whereas the combined use of all the recurring units of the general formulae (1) to (4) enables to satisfy both a high resolution and a minimized proximity bias.

In a first aspect, the present invention provides a polymer which increases a dissolution rate in an alkali developer under the action of an acid. The polymer comprises recurring units having the general formulae (1), (2), (3) and (4), the recurring units being of at least one type for each formula.

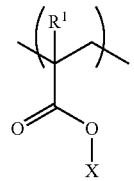
(1)

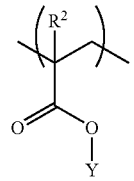
(2)

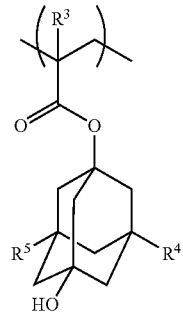
(3)

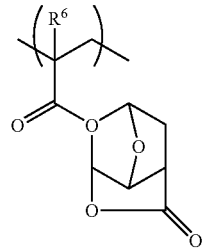
(4)

Herein $R^1$, $R^2$, $R^3$ and $R^6$ are each independently hydrogen or methyl, $R^4$ and $R^5$ are each independently hydrogen or hydroxyl, X is a tertiary exo-alkyl group having a bicyclo

[2.2.1]heptane framework, represented by any of the general formulae (X-1) to (X-4):

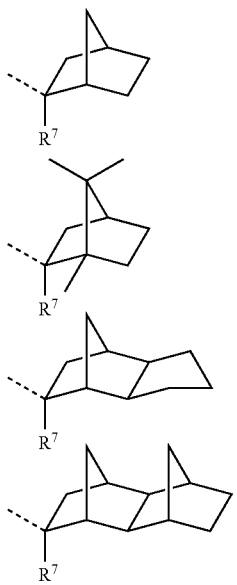

wherein $R^7$ is a straight, branched or cyclic alkyl group having 1 to 10 carbon atoms, and a broken line depicts a bonding position and a bonding direction, and Y is a tertiary alkyl group having an adamantane structure.

Preferably, Y in the recurring units of formula (2) has any one of the formulae (Y-1) to (Y-3):

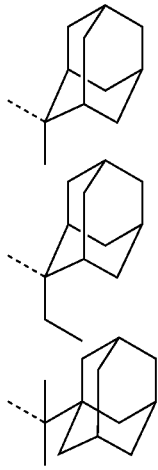

wherein a broken line depicts a bonding position.

In a preferred embodiment, the polymer has a weight average molecular weight of 1,000 to 50,000, and the molar fractions of the recurring units of formulae (1), (3) and (4) each are at least 5%, and the molar fraction of the recurring units of formula (2) is at least 2%.

In a second aspect, the present invention provides a resist composition comprising the polymer defined above, preferably a resist composition comprising (A) the polymer, (B) a photoacid generator, (C) an organic solvent, and optionally (D) a nitrogen containing organic compound.

In a third aspect, the present invention provides a process for forming a resist pattern comprising the steps of (1) applying the resist composition defined above onto a substrate to form a coating; (2) heat treating the coating and then exposing it to high-energy radiation having a wavelength of up to 300 nm or electron beams through a photomask; and (3) heat treating the exposed coating and developing it with a developer.

The inventive resist composition prepared using the inventive polymer lends itself to micropatterning with electron beams or deep UV since it is sensitive to high-energy radiation and is improved in resolution and proximity bias (e.g., size difference between densely and sparsely packed pattern areas). Especially because of the minimized absorption at the exposure wavelength of an ArF or KrF excimer laser, the composition can be processed by photolithography using such a laser, to form a finely defined complex pattern. The polymer is thus best suited as the base resin in resist compositions for VLSI fabrication.

DESCRIPTION OF THE PREFERRED EMBODIMENTS

The polymer of the invention is a resin which increases a dissolution rate in an alkali developer under the action of an acid, and is characterized by comprising recurring units having the general formulae (1), (2), (3) and (4), the recurring units being of at least one type for each formula.

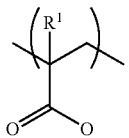

(1)

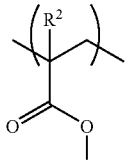

(2)

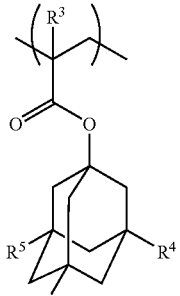

(3)

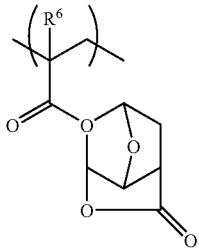

(4)

Herein $R^1$, $R^2$, $R^3$ and $R^6$ are each independently hydrogen or methyl, $R^4$ and $R^5$ are each independently hydrogen or hydroxyl, X is a tertiary exo-alkyl group having a bicyclo

[2.2.1]heptane framework, represented by any of the general formulae (X-1) to (X-4), and Y is a tertiary alkyl group having an adamantane structure.

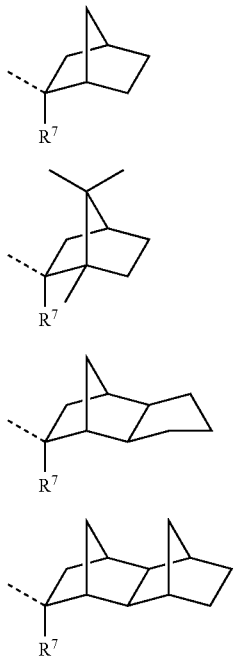

(X-1)

(X-2)

(X-3)

(X-4)

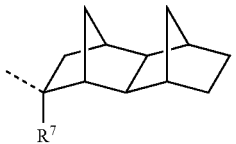

(X-4-1)

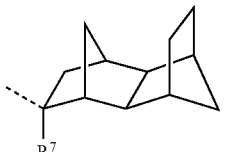

(X-4-2)

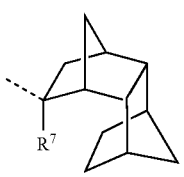

(X-4-3)

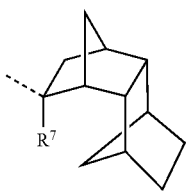

(X-4-4)

Herein $R^7$ is a straight, branched or cyclic alkyl group having 1 to 10 carbon atoms, and a broken line depicts a bonding position and a bonding direction.

In formula (1), $R^1$ is hydrogen or methyl and X is a tertiary exo-alkyl group having a bicyclo[2.2.1]heptane framework, represented by any of the general formulae (X-1) to (X-4) wherein $R^7$ is a straight, branched or cyclic $C_1$–$C_{10}$ alkyl group, and a broken line depicts a bonding position and a bonding direction.

It is noted that the general formula (X-3) collectively represents one or a mixture of groups having the following general formulae (X-3-1) and (X-3-2).

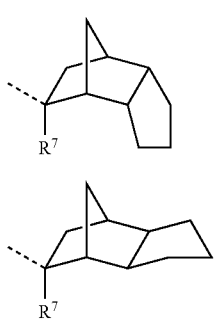

(X-3-1)

(X-3-2)

Herein $R^7$ is a straight, branched or cyclic $C_1$–$C_{10}$ alkyl group, and a broken line depicts a bonding position and a bonding direction.

Also, the general formula (X-4) collectively represents one or a mixture of groups having the following general formulae (X-4-1) to (X-4-4).

Herein $R^7$ is a straight, branched or cyclic $C_1$–$C_{10}$ alkyl group, and a broken line depicts a bonding position and a bonding direction.

It should be understood that the formulae (X-1) to (X-4), (X-3-1), (X-3-2), and (X-4-1) to (X-4-4) each collectively represent an enantiomer thereof and a mixture of enantiomers.

The bonding direction of the alkyl group represented by the formulae (X-1) to (X-4), (X-3-1), (X-3-2), and (X-4-1) to (X-4-4) is on the exo side relative to the bicyclo[2.2.1] heptane ring, which ensures high reactivity in acid-catalyzed elimination reaction and eventually allows a resist composition utilizing the polymer to accomplish a high contrast and high resolution. When a monomer substituted with a tertiary exo-alkyl group having a bicyclo[2.2.1]heptane framework, represented by any of the general formulae (X-1) to (X-4) is prepared, the product may also include a monomer substituted with an endo-alkyl group represented by the following general formulae (endo-X-1) to (endo-X-4). To ensure satisfactory reactivity, the exo proportion is preferably at least 50 molt, and more preferably at least 80 molt of the product.

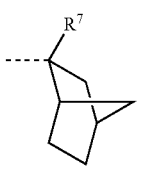

(endo-X-1)

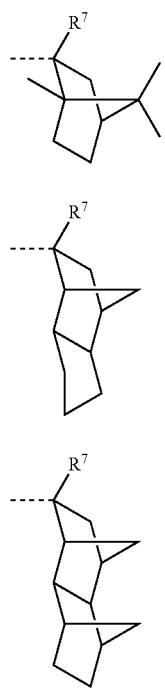
(endo-X-2)
(endo-X-3)
(endo-X-4)
In formulae (endo-X-1) to (endo-X-4), $R^7$ is a straight, branched or cyclic $C_1$–$C_{10}$ alkyl group, and a broken line depicts a bonding position and a bonding direction.
Illustrative, non-limiting examples of the recurring units of formula (1) are given below.
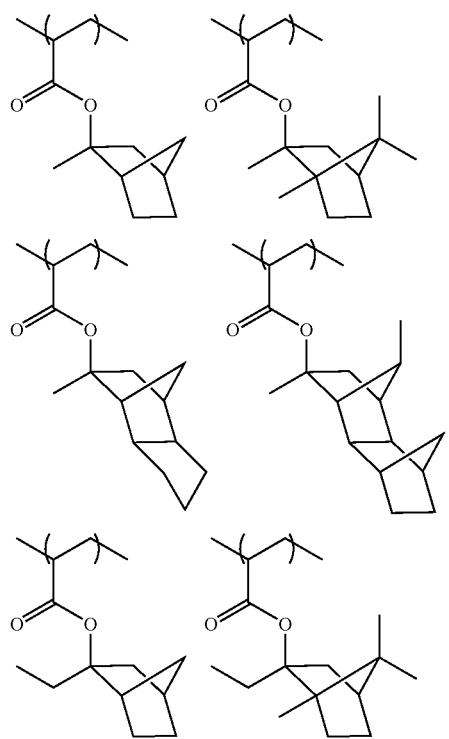
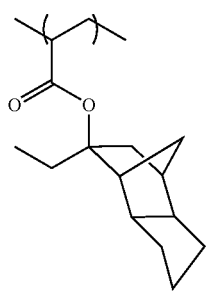 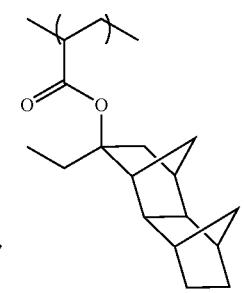
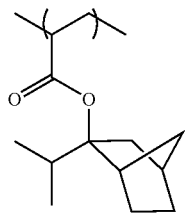 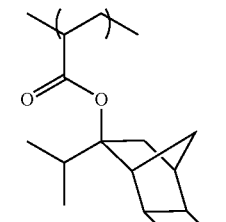
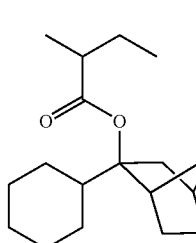 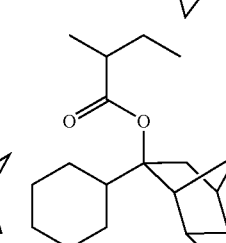
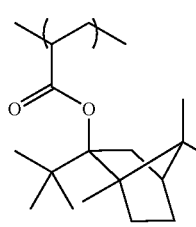 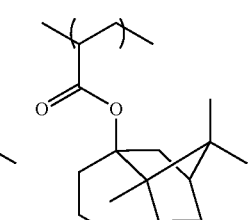
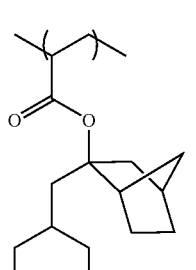 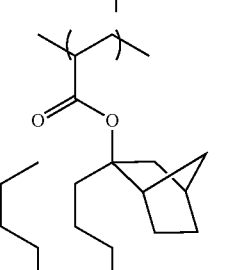
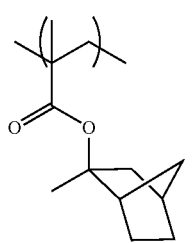 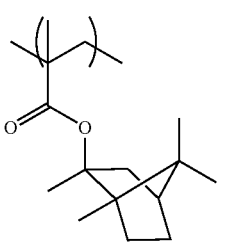

-continued

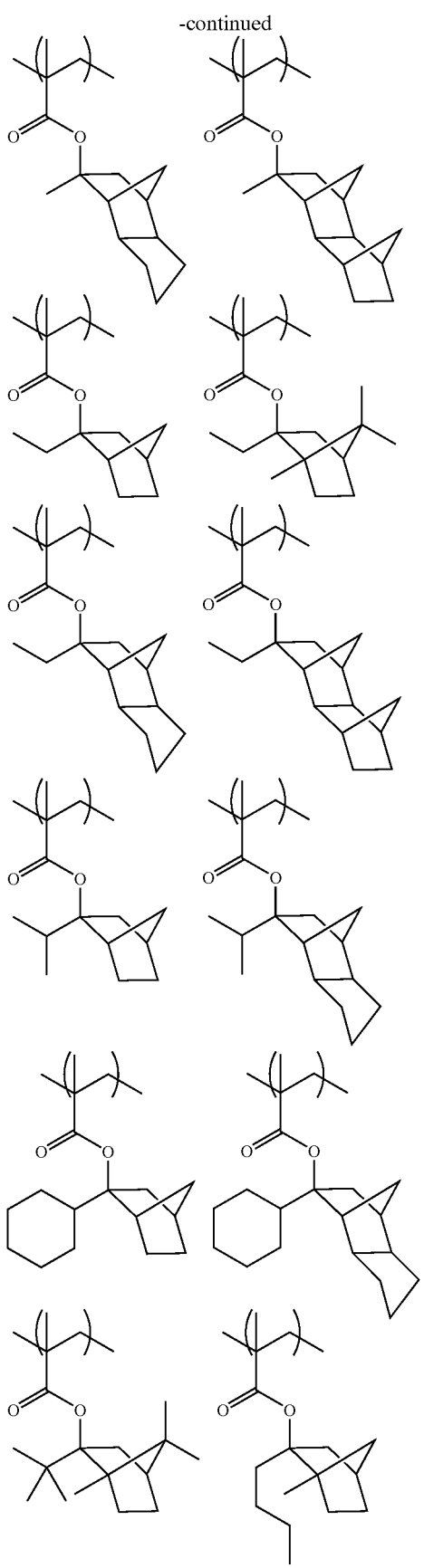
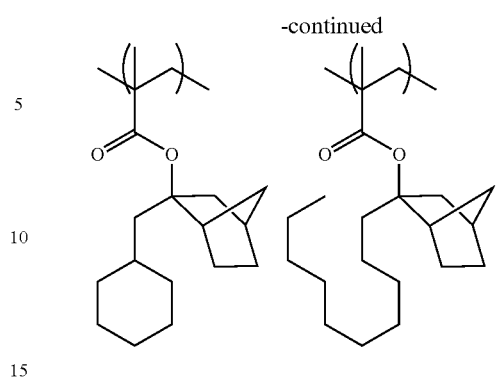

In formula (2), $R^2$ is hydrogen or methyl, and Y is a tertiary alkyl group having an adamantane structure. Y is preferably any one of the formulae (Y-1) to (Y-3).

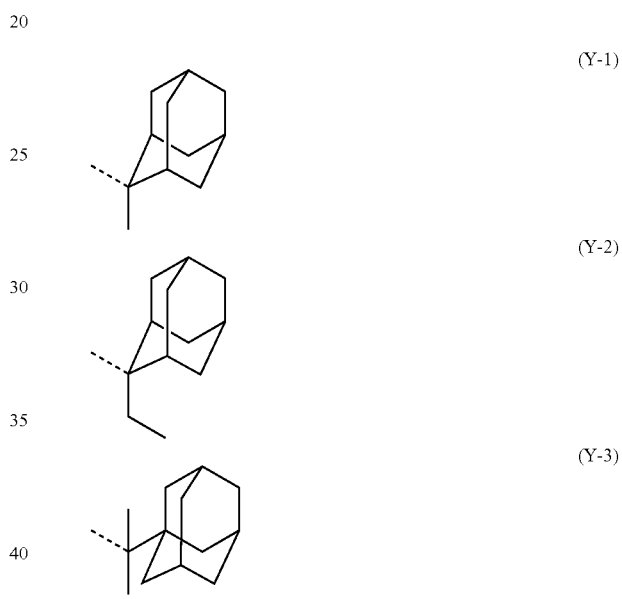

Herein, a broken line depicts a bonding position.

It is believed that the use of recurring units of formula (2) in combination with recurring units of formula (1) is effective for holding down the proximity bias to a low level as compared with the use of recurring units of formula (1) alone as acid-labile units. It is also believed that the introduction of recurring units of formula (2) has a positive impact on etching resistance. Illustrative, non-limiting examples of the recurring units of formula (2) are given below.

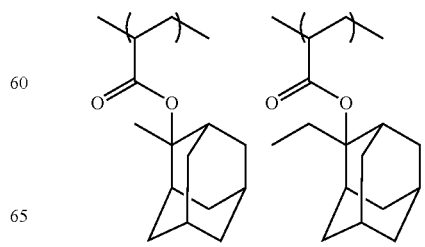

-continued

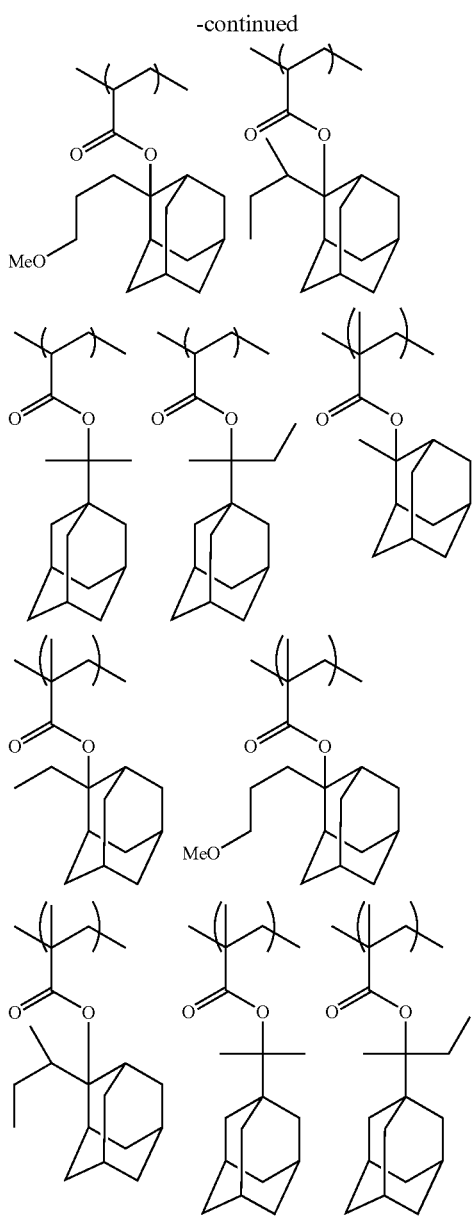

In formula (3), $R^3$ is hydrogen or methyl, $R^4$ and $R^5$ are each independently hydrogen or a hydroxyl group.

Illustrative examples of the recurring units of formula (3) are given below.

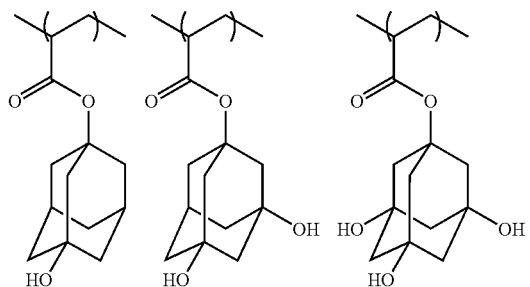

-continued

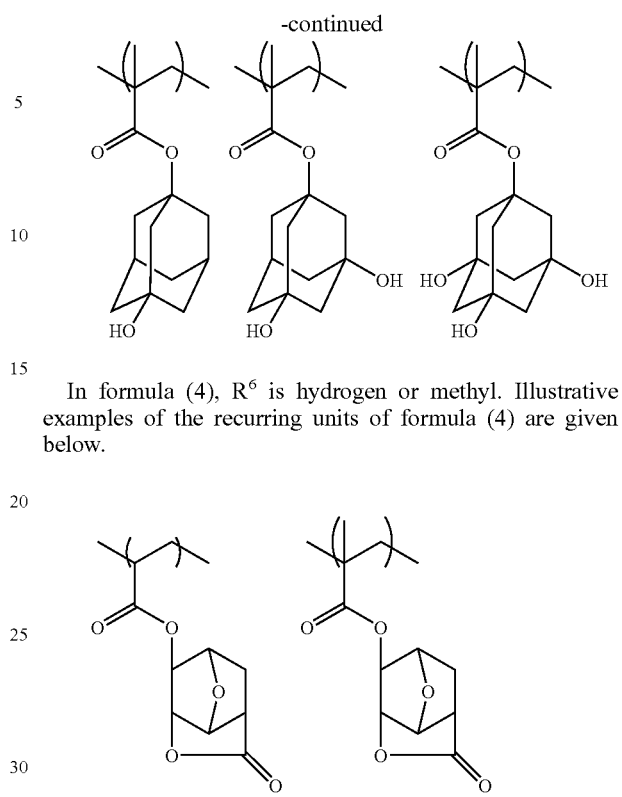

In formula (4), $R^6$ is hydrogen or methyl. Illustrative examples of the recurring units of formula (4) are given below.

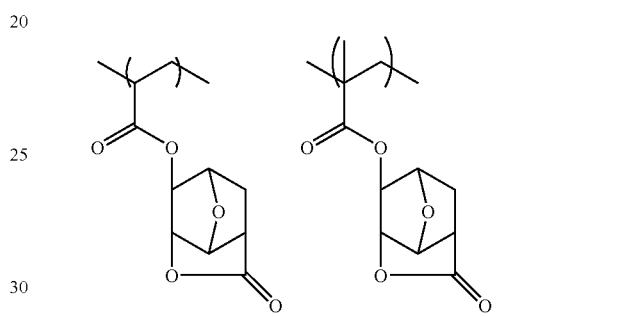

The inventive polymer can be prepared by using acrylate esters (where $R^1$, $R^2$, $R^3$ and $R^6$ in formulae (1) to (4) are hydrogen) or methacrylate esters (where $R^1$, $R^2$, $R^3$ and $R^6$ in formulae (1) to (4) are methyl) corresponding to the recurring units of formulae (1), (2), (3) and (4), respectively, as starting reactants, and effecting polymerization in a conventional manner such as radical or cationic polymerization. In the case of radical polymerization, for example, acrylate or methacrylate reactants are mixed with a radical initiator in a solvent, and reaction is effected while optionally heating or cooling the reaction mixture. For the polymerization reaction, a chain transfer agent may be added if desired.

In addition to the recurring units of formulae (1), (2), (3) and (4), the inventive polymer may further include recurring units which can be introduced by copolymerization of another polymerizable monomer(s). Illustrative, non-limiting examples of other polymerizable monomers include α,β-unsaturated carboxylic acid esters such as other acrylates, other methacrylates, crotonates, maleates, and itaconates; α,β-unsaturated carboxylic acids such as acrylic acid, methacrylic acid, maleic acid, and itaconic acid; acrylonitrile; methacrylonitrile; α,β-unsaturated lactones such as 5,5-dimethyl-3-methylene-2-oxotetrahydrofuran; cyclic olefins such as norbornene derivatives and tetracyclo[$4.4.0.1^{2,5}.1^{7,10}$]dodecene derivatives; α,β-unsaturated carboxylic acid anhydrides such as maleic anhydride and itaconic anhydride; allyl ethers; vinyl ethers; vinyl esters; and vinyl silanes.

In prior art resist compositions, limiting resolution, mask fidelity and fogging exposure resistance are generally in a trade-off relationship and it is difficult to find a good compromise therebetween. By selecting optimum ones from recurring units of many types that can be combined and predetermining an optimum value for their proportion, the polymer of the invention can formulate a resist composition which satisfies both the factors at a high level and in a good balance. The polymer of the invention is improved in this respect too.

Illustrative, non-limiting examples of the inventive polymers comprising recurring units, each of at least one type, having the general formulae (1) to (4) are given below.

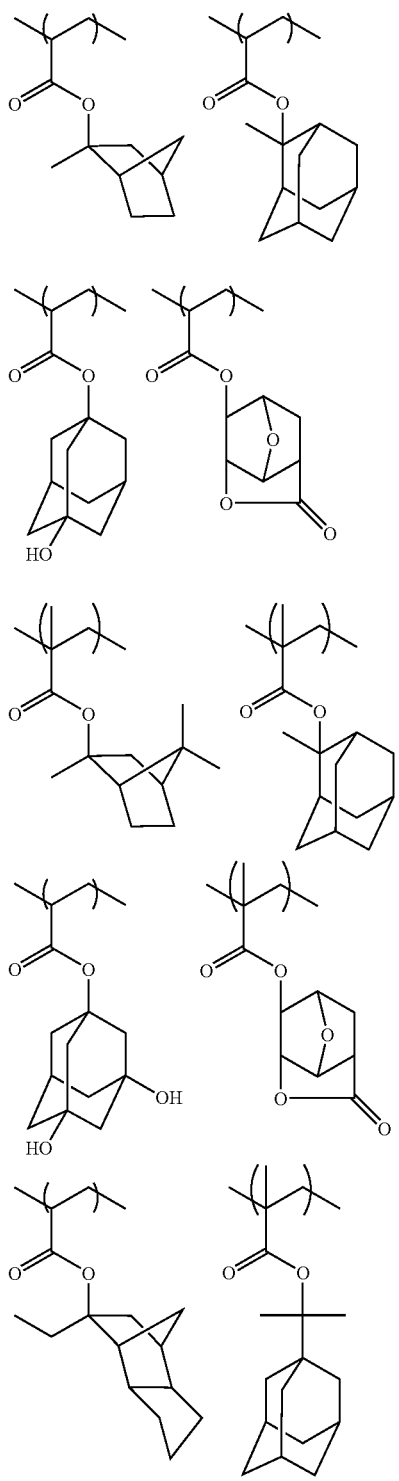

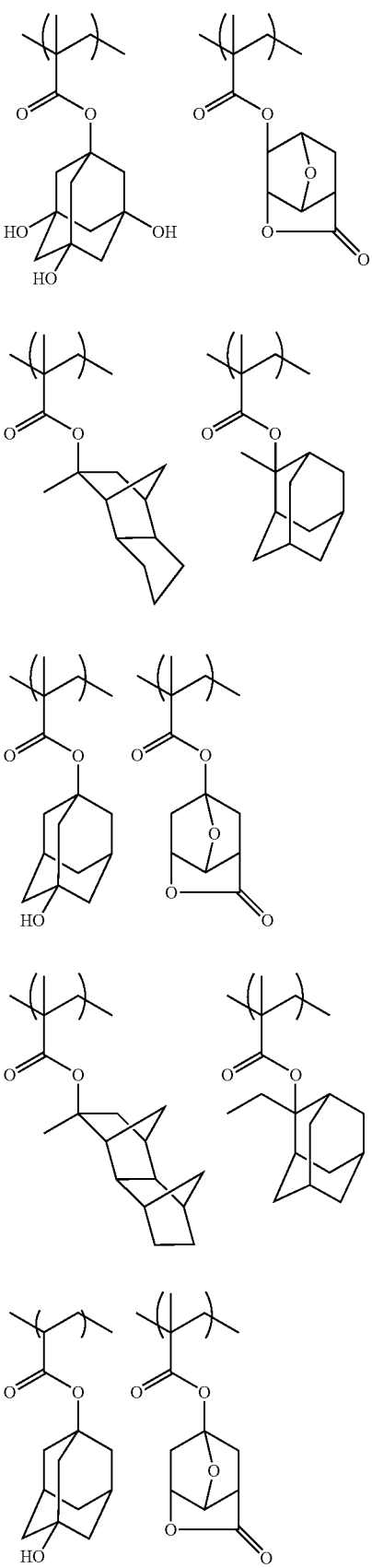

-continued

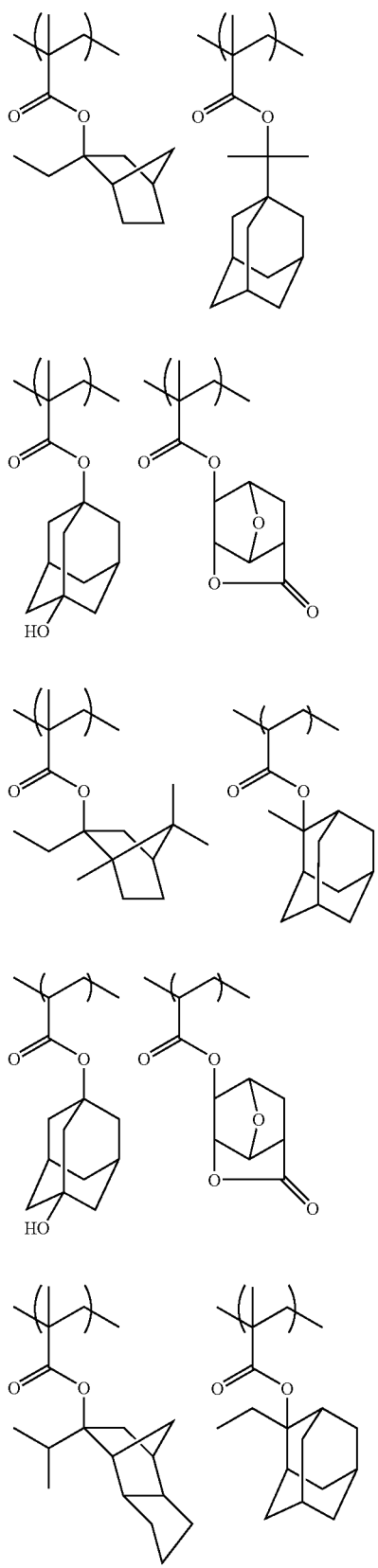

-continued

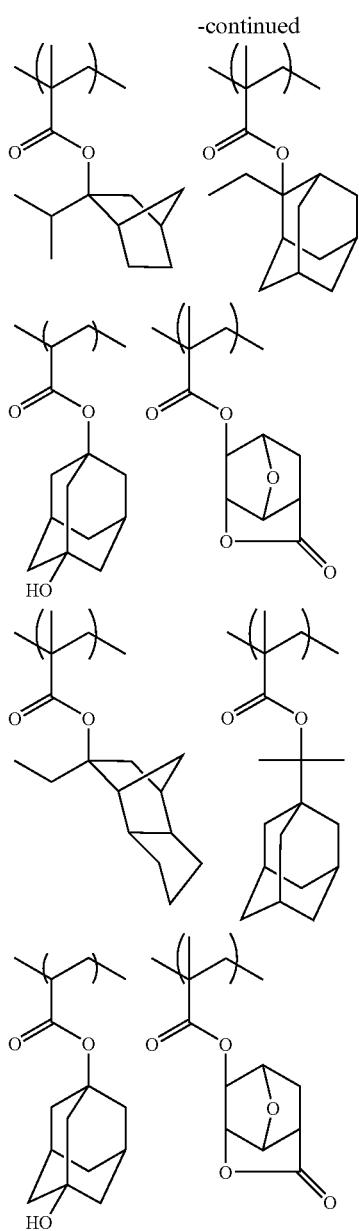

The polymer of the invention should preferably have a weight average molecular weight (Mw) of 1,000 to 50,000. With a Mw of less than 1,000, film formation and resolution may be poor whereas a Mw of more than 50,000 can compromise resolution. The Mw of the polymer can be adjusted by suitably selecting the polymerization and purification method.

In a preferred embodiment, the molar fractions of the recurring units of formulae (1), (3) and (4) in the polymer each are at least 5% and the molar fraction of the recurring units of formula (2) is at least 2%. If the molar fraction of the recurring units of any one of formulae (1), (3) and (4) is less than 5% or the molar fraction of the recurring units of formula (2) is less than 2%, resolution and proximity bias may be poor. In a more preferred embodiment of the inventive polymer, the molar fraction of recurring units of formula (1) is from 10% to less than 70%, the molar fraction of recurring units of formula (2) is from 2% to less than 60%, the molar fraction of recurring units of formula (3) is from 10% to less than 60%, and the molar fraction of recurring units of formula (4) is from 10% to less than 60%.

In an embodiment wherein the molar fractions of the recurring units of formulae (1) to (4) sum to less than 100%, the balance may consist of recurring units derived from any of α,β-unsaturated carboxylic acid esters such as other acrylates, other methacrylates, crotonates, maleates, and itaconates; α,β-unsaturated carboxylic acids such as acrylic acid, methacrylic acid, maleic acid, and itaconic acid; acrylonitrile; methacrylonitrile; α,β-unsaturated lactones such as 5,5-dimethyl-3-methylene-2-oxotetrahydrofuran; cyclic olefins such as norbornene derivatives and tetracyclo[4.4.0.1$^{2,5}$.1$^{7,10}$]dodecene derivatives; α,β-unsaturated carboxylic acid anhydrides such as maleic anhydride and itaconic anhydride; allyl ethers; vinyl ethers; vinyl esters; and vinyl silanes.

Advantageously, the polymer of the invention is used as a base resin in a resist composition, especially a chemically amplified positive resist composition. Therefore, the present invention in the second aspect provides a resist composition, especially a positive resist composition, comprising the above-described polymer. The resist composition is typically comprised of (A) the above-described polymer as a base resin, (B) a photoacid generator, (C) an organic solvent, and optionally (D) a nitrogen containing organic compound.

If desired, the base resin as component (A) may include, in addition to the inventive polymer, another resin which increases a dissolution rate in an alkali developer under the action of an acid. The inventive polymer is preferably present in an amount of 10 to 100% by weight, more preferably 30 to 100% by weight, most preferably 50 to 100% by weight of the entire base resin.

The photoacid generator (B) may be any compound capable of generating an acid upon exposure to high energy radiation. Preferred photoacid generators are sulfonium salts, iodonium salts, sulfonyldiazomethanes, and N-sulfonyloxyimides. These photoacid generators are illustrated below while they may be used alone or in admixture of two or more.

Sulfonium salts are salts of sulfonium cations with sulfonates. Exemplary sulfonium cations include triphenylsulfonium, (4-tert-butoxyphenyl)diphenylsulfonium, bis(4-tert-butoxyphenyl)phenylsulfonium, tris(4-tert-butoxyphenyl)sulfonium, (3-tert-butoxyphenyl)diphenylsulfonium, bis(3-tert-butoxyphenyl)phenylsulfonium, tris(3-tert-butoxyphenyl)sulfonium, (3,4-di-tert-butoxyphenyl)diphenylsulfonium, bis(3,4-di-tert-butoxyphenyl)phenylsulfonium, tris(3,4-di-tert-butoxyphenyl)sulfonium, diphenyl(4-thiophenoxyphenyl)sulfonium, (4-tert-butoxycarbonylmethyloxyphenyl)diphenylsulfonium, tris(4-tert-butoxycarbonylmethyloxyphenyl)sulfonium, (4-tert-butoxyphenyl)bis(4-dimethylaminophenyl)sulfonium, tris(4-dimethylaminophenyl)sulfonium, 2-naphthyldiphenylsulfonium, dimethyl-2-naphthylsulfonium, 4-hydroxyphenyldimethylsulfonium, 4-methoxyphenyldimethylsulfonium, trimethylsulfonium, 2-oxocyclohexylcyclohexylmethylsulfonium, trinaphthylsulfonium, tribenzylsulfonium, diphenylmethylsulfonium, dimethylphenylsulfonium, and 2-oxo-2-phenylethylthiacyclopentanium. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, mesitylenesulfonate, 2,4,6-triisopropylbenzenesulfonate, toluenesulfonate, benzenesulfonate, 4-(4'-toluenesulfonyloxy)benzenesulfonate, naphthalenesulfonate, camphorsulfonate, octanesulfonate, dodecylbenzenesulfonate, butanesulfonate, and methanesulfonate. Sulfonium salts based on combination of the foregoing examples are included.

Iodinium salts are salts of iodonium cations with sulfonates. Exemplary iodinium cations are aryliodonium cations including diphenyliodinium, bis(4-tert-butylphenyl)iodonium, 4-tert-butoxyphenylphenyliodonium, and 4-methoxyphenylphenyliodonium. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, mesitylenesulfonate, 2,4,6-triisopropylbenzenesulfonate, toluenesulfonate, benzenesulfonate, 4-(4'-toluenesulfonyloxy)benzenesulfonate, naphthalenesulfonate, camphorsulfonate, octanesulfonate, dodecylbenzenesulfonate, butanesulfonate, and methanesulfonate. Iodonium salts based on combination of the foregoing examples are included.

Exemplary sulfonyldiazomethane compounds include bissulfonyldiazomethane compounds and sulfonyl-carbonyldiazomethane compounds such as
bis(ethylsulfonyl)diazomethane,
bis(1-methylpropylsulfonyl)diazomethane,
bis(2-methylpropylsulfonyl)diazomethane,
bis(1,1-dimethylethylsulfonyl)diazomethane,
bis(cyclohexylsulfonyl)diazomethane,
bis(perfluoroisopropylsulfonyl)diazomethane,
bis(phenylsulfonyl)diazomethane,
bis(4-methylphenylsulfonyl)diazomethane,
bis(2,4-dimethylphenylsulfonyl)diazomethane,
bis(2-naphthylsulfonyl)diazomethane,
bis(4-acetyloxyphenylsulfonyl)diazomethane,
bis(4-methanesulfonyloxyphenylsulfonyl)diazomethane,
bis(4-(4-toluenesulfonyloxy)phenylsulfonyl)diazomethane,
bis(4-(n-hexyloxy)phenylsulfonyl)diazomethane,
bis(2-methyl-4-(n-hexyloxy)phenylsulfonyl)diazomethane,
bis(2,5-dimethyl-4-(n-hexyloxy)phenylsulfonyl)diazomethane,
bis(3,5-dimethyl-4-(n-hexyloxy)phenylsulfonyl)diazomethane,
bis(2-methyl-5-isopropyl-4-(n-hexyloxy)phenylsulfonyl)diazomethane,
4-methylphenylsulfonylbenzoyldiazomethane,
tert-butylcarbonyl-4-methylphenylsulfonyldiazomethane,
2-naphthylsulfonylbenzoyldiazomethane,
4-methylphenylsulfonyl-2-naphthoyldiazomethane,
methylsulfonylbenzoyldiazomethane, and
tert-butoxycarbonyl-4-methylphenylsulfonyldiazomethane.

N-sulfonyloxyimide photoacid generators include combinations of imide skeletons with sulfonates. Exemplary imide skeletons are succinimide, naphthalene dicarboxylic acid imide, phthalimide, cyclohexyldicarboxylic acid imide, 5-norbornene-2,3-dicarboxylic acid imide, and 7-oxabicyclo[2.2.1]-5-heptene-2,3-dicarboxylic acid imide. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, mesitylenesulfonate, 2,4,6-triisopropylbenzenesulfonate, toluenesulfonate, benzenesulfonate, naphthalenesulfonate, camphorsulfonate, octanesulfonate, dodecylbenzenesulfonate, butanesulfonate, and methanesulfonate.

Benzoinsulfonate photoacid generators include benzoin tosylate, benzoin mesylate, and benzoin butanesulfonate.

Pyrogallol trisulfonate photoacid generators include pyrogallol, fluoroglycinol, catechol, resorcinol, and hydroquinone, in which all the hydroxyl groups are replaced by trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate.

Nitrobenzyl sulfonate photoacid generators include 2,4-dinitrobenzyl sulfonates, 2-nitrobenzyl sulfonates, and 2,6-dinitrobenzyl sulfonates, with exemplary sulfonates including trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate. Also useful are analogous nitrobenzyl sulfonate compounds in which the nitro group on the benzyl side is replaced by a trifluoromethyl group.

Sulfone photoacid generators include
bis(phenylsulfonyl)methane,
bis(4-methylphenylsulfonyl)methane,
bis(2-naphthylsulfonyl)methane,
2,2-bis(phenylsulfonyl)propane,
2,2-bis(4-methylphenylsulfonyl)propane,
2,2-bis(2-naphthylsulfonyl)propane,
2-methyl-2-(p-toluenesulfonyl)propiophenone,
2-cyclohexylcarbonyl-2-(p-toluenesulfonyl)propane, and
2,4-dimethyl-2-(p-toluenesulfonyl)pentan-3-one.

Photoacid generators in the form of glyoxime derivatives are as described in Japanese Patent No. 2,906,999 and JP-A 9-301948. Examples include
bis-O-(p-toluenesulfonyl)-α-dimethylglyoxime,
bis-O-(p-toluenesulfonyl)-α-diphenylglyoxime,
bis-O-(p-toluenesulfonyl)-α-dicyclohexylglyoxime,
bis-O-(p-toluenesulfonyl)-2,3-pentanedioneglyoxime,
bis-O-(n-butanesulfonyl)-α-dimethylglyoxime,
bis-O-(n-butanesulfonyl)-α-diphenylglyoxime,
bis-O-(n-butanesulfonyl)-α-dicyclohexylglyoxime,
bis-O-(methanesulfonyl)-α-dimethylglyoxime,
bis-O-(trifluoromethanesulfonyl)-α-dimethylglyoxime,
bis-O-(2,2,2-trifluoroethanesulfonyl)-α-dimethylglyoxime,
bis-O-(10-camphorsulfonyl)-α-dimethylglyoxime,
bis-O-(benzenesulfonyl)-α-dimethylglyoxime,
bis-O-(p-fluorobenzenesulfonyl)-α-dimethylglyoxime,
bis-O-(p-trifluoromethylbenzenesulfonyl)-α-dimethylglyoxime,
bis-O-(xylenesulfonyl)-α-dimethylglyoxime,
bis-O-(trifluoromethanesulfonyl)-nioxime,
bis-O-(2,2,2-trifluoroethanesulfonyl)-nioxime,
bis-O-(10-camphorsulfonyl)-nioxime,
bis-O-(benzenesulfonyl)-nioxime,
bis-O-(p-fluorobenzenesulfonyl)-nioxime,
bis-O-(p-trifluoromethylbenzenesulfonyl)-nioxime, and
bis-O-(xylenesulfonyl)-nioxime.

Also included are the oxime sulfonates described in U.S. Pat. No. 6,004,724, for example,
(5-(4-toluenesulfonyl)oxyimino-5H-thiophen-2-ylidene)phenylacetonitrile,
(5-(10-camphorsulfonyl)oxyimino-5H-thiophen-2-ylidene)phenylacetonitrile,
(5-n-octanesulfonyloxyimino-5H-thiophen-2-ylidene)phenylacetonitrile, (5-(4-toluenesulfonyl)oxyimino-5H-thiophen-2-ylidene)(2-methylphenyl)acetonitrile,
(5-(10-camphorsulfonyl)oxyimino-5H-thiophen-2-ylidene)(2-methylphenyl)acetonitrile,
(5-n-octanesulfonyloxyimino-5H-thiophen-2-ylidene)(2-methylphenyl)acetonitrile, etc.

Also included are the oxime sulfonates described in U.S. Pat. No. 6,261,738 and JP-A 2000-314956, for example,
2,2,2-trifluoro-1-phenyl-ethanone oxime-O-methylsulfonate;
2,2,2-trifluoro-1-phenyl-ethanone oxime-O-(10-camphorylsulfonate);
2,2,2-trifluoro-1-phenyl-ethanone oxime-O-(4-methoxyphenylsulfonate);
2,2,2-trifluoro-1-phenyl-ethanone oxime-O-(1-naphthylsulfonate);
2,2,2-trifluoro-1-phenyl-ethanone oxime-O-(2-naphthylsulfonate);
2,2,2-trifluoro-1-phenyl-ethanone oxime-O-(2,4,6-trimethylphenylsulfonate);
2,2,2-trifluoro-1-(4-methylphenyl)-ethanone oxime-O-(10-camphorylsulfonate);
2,2,2-trifluoro-1-(4-methylphenyl)-ethanone oxime-O-(methylsulfonate);
2,2,2-trifluoro-1-(2-methylphenyl)-ethanone oxime-O-(10-camphorylsulfonate);
2,2,2-trifluoro-1-(2,4-dimethylphenyl)-ethanone oxime-O-(10-camphorylsulfonate);
2,2,2-trifluoro-1-(2,4-dimethylphenyl)-ethanone oxime-O-(1-naphthylsulfonate);
2,2,2-trifluoro-1-(2,4-dimethylphenyl)-ethanone oxime-O-(2-naphthylsulfonate);
2,2,2-trifluoro-1-(2,4,6-trimethylphenyl)-ethanone oxime-O-(10-camphorylsulfonate);
2,2,2-trifluoro-1-(2,4,6-trimethylphenyl)-ethanone oxime-O-(1-naphthylsulfonate);
2,2,2-trifluoro-1-(2,4,6-trimethylphenyl)-ethanone oxime-O-(2-naphthylsulfonate);
2,2,2-trifluoro-1-(4-methoxyphenyl)-ethanone oxime-O-methylsulfonate;
2,2,2-trifluoro-1-(4-methylthiophenyl)-ethanone oxime-O-methylsulfonate;
2,2,2-trifluoro-1-(3,4-dimethoxyphenyl)-ethanone oxime-O-methylsulfonate;
2,2,3,3,4,4,4-heptafluoro-1-phenyl-butanone oxime-O-(10-camphorylsulfonate);
2,2,2-trifluoro-1-(phenyl)-ethanone oxime-O-methylsulfonate;
2,2,2-trifluoro-1-(phenyl)-ethanone oxime-O-10-camphorylsulfonate;
2,2,2-trifluoro-1-(phenyl)-ethanone oxime-O-(4-methoxyphenyl)sulfonate;
2,2,2-trifluoro-1-(phenyl)-ethanone oxime-O-(1-naphthyl)sulfonate;
2,2,2-trifluoro-1-(phenyl)-ethanone oxime-O-(2-naphthyl)sulfonate;
2,2,2-trifluoro-1-(phenyl)-ethanone oxime-O-(2,4,6-trimethylphenyl)sulfonate;
2,2,2-trifluoro-1-(4-methylphenyl)-ethanone oxime-O-(10-camphoryl)sulfonate;
2,2,2-trifluoro-1-(4-methylphenyl)-ethanone oxime-O-methylsulfonate;
2,2,2-trifluoro-1-(2-methylphenyl)-ethanone oxime-O-(10-camphoryl)sulfonate;
2,2,2-trifluoro-1-(2,4-dimethylphenyl)-ethanone oxime-O-(1-naphthyl)sulfonate;
2,2,2-trifluoro-1-(2,4-dimethylphenyl)-ethanone oxime-O-(2-naphthyl)sulfonate;
2,2,2-trifluoro-1-(2,4,6-trimethylphenyl)-ethanone oxime-O-(10-camphoryl)sulfonate;
2,2,2-trifluoro-1-(2,4,6-trimethylphenyl)-ethanone oxime-O-(1-naphthyl)sulfonate;
2,2,2-trifluoro-1-(2,4,6-trimethylphenyl)-ethanone oxime-O-(2-naphthyl)sulfonate;
2,2,2-trifluoro-1-(4-methoxyphenyl)-ethanone oxime-O-methylsulfonate;
2,2,2-trifluoro-1-(4-thiomethylphenyl)-ethanone oxime-O-methylsulfonate;
2,2,2-trifluoro-1-(3,4-dimethoxyphenyl)-ethanone oxime-O-methylsulfonate;
2,2,2-trifluoro-1-(4-methoxyphenyl)-ethanone oxime-O-(4-methylphenyl)sulfonate;
2,2,2-trifluoro-1-(4-methoxyphenyl)-ethanone oxime-O-(4-methoxyphenyl)sulfonate;
2,2,2-trifluoro-1-(4-methoxyphenyl)-ethanone oxime-O-(4-dodecylphenyl)sulfonate;
2,2,2-trifluoro-1-(4-methoxyphenyl)-ethanone oxime-O-octylsulfonate;
2,2,2-trifluoro-1-(4-thiomethylphenyl)-ethanone oxime-O-(4-methoxyphenyl)sulfonate;
2,2,2-trifluoro-1-(4-thiomethylphenyl)-ethanone oxime-O-(4-dodecylphenyl)sulfonate;
2,2,2-trifluoro-1-(4-thiomethylphenyl)-ethanone oxime-O-octylsulfonate;
2,2,2-trifluoro-1-(4-thiomethylphenyl)-ethanone oxime-O-(2-naphthyl)sulfonate;
2,2,2-trifluoro-1-(2-methylphenyl)-ethanone oxime-O-methylsulfonate;
2,2,2-trifluoro-1-(4-methylphenyl)-ethanone oxime-O-phenylsulfonate;
2,2,2-trifluoro-1-(4-chlorophenyl)-ethanone oxime-O-phenylsulfonate;
2,2,3,3,4,4,4-heptafluoro-1-(phenyl)-butanone oxime-O-(10-camphoryl)sulfonate;
2,2,2-trifluoro-1-naphthyl-ethanone oxime-O-methylsulfonate;
2,2,2-trifluoro-2-naphthyl-ethanone oxime-O-methylsulfonate;
2,2,2-trifluoro-1-[4-benzylphenyl]-ethanone oxime-O-methylsulfonate;
2,2,2-trifluoro-1-[4-(phenyl-1,4-dioxa-but-1-yl)phenyl]-ethanone oxime-O-methylsulfonate;
2,2,2-trifluoro-1-naphthyl-ethanone oxime-O-propylsulfonate;
2,2,2-trifluoro-2-naphthyl-ethanone oxime-O-propylsulfonate;
2,2,2-trifluoro-1-[4-benzylphenyl]-ethanone oxime-O-propylsulfonate;
2,2,2-trifluoro-1-[4-methylsulfonylphenyl]-ethanone oxime-O-propylsulfonate;
1,3-bis[1-(4-phenoxyphenyl)-2,2,2-trifluoroethanone oxime-O-sulfonyl]phenyl;
2,2,2-trifluoro-1-[4-methylsulfonyloxyphenyl]-ethanone oxime-O-propylsulfonate;
2,2,2-trifluoro-1-[4-methylcarbonyloxyphenyl]-ethanone oxime-O-propylsulfonate;
2,2,2-trifluoro-1-[6H, 7H-5,8-dioxonaphth-2-yl]-ethanone oxime-O-propylsulfonate;
2,2,2-trifluoro-1-[4-methoxycarbonylmethoxyphenyl]-ethanone oxime-O-propylsulfonate;
2,2,2-trifluoro-1-[4-(methoxycarbonyl)-(4-amino-1-oxa-pent-1-yl)-phenyl]-ethanone oxime-O-propylsulfonate;

2,2,2-trifluoro-1-[3,5-dimethyl-4-ethoxyphenyl]-ethanone oxime-O-propylsulfonate;
2,2,2-trifluoro-1-[4-benzyloxyphenyl]-ethanone oxime-O-propylsulfonate;
2,2,2-trifluoro-1-[2-thiophenyl]-ethanone oxime-O-propylsulfonate; and
2,2,2-trifluoro-1-[1-dioxa-thiophen-2-yl)]-ethanone oxime-O-propylsulfonate.

Also included are the oxime sulfonates described in JP-A 9-95479 and JP-A 9-230588 and the references cited therein, for example,
α-(p-toluenesulfonyloxyimino)-phenylacetonitrile,
α-(p-chlorobenzenesulfonyloxyimino)-phenylacetonitrile,
α-(4-nitrobenzenesulfonyloxyimino)-phenylacetonitrile,
α-(4-nitro-2-trifluoromethylbenzenesulfonyloxyimino)-phenylacetonitrile,
α-(benzenesulfonyloxyimino)-4-chlorophenylacetonitrile,
α-(benzenesulfonyloxyimino)-2,4-dichlorophenylacetonitrile,
α-(benzenesulfonyloxyimino)-2,6-dichlorophenylacetonitrile,
α-(benzenesulfonyloxyimino)-4-methoxyphenylacetonitrile,
α-(2-chlorobenzenesulfonyloxyimino)-4-methoxyphenylacetonitrile,
α-(benzenesulfonyloxyimino)-2-thienylacetonitrile,
α-(4-dodecylbenzenesulfonyloxyimino)-phenylacetonitrile,
α-[(4-toluenesulfonyloxyimino)-4-methoxyphenyl]acetonitrile,
α-[(dodecylbenzenesulfonyloxyimino)-4-methoxyphenyl]-acetonitrile,
α-(tosyloxyimino)-3-thienylacetonitrile,
α-(methylsulfonyloxyimino)-1-cyclopentenylacetonitrile,
α-(ethylsulfonyloxyimino)-1-cyclopentenylacetonitrile,
α-(isopropylsulfonyloxyimino)-1-cyclopentenylacetonitrile,
α-(n-butylsulfonyloxyimino)-1-cyclopentenylacetonitrile,
α-(ethylsulfonyloxyimino)-1-cyclohexenylacetonitrile,
α-(isopropylsulfonyloxyimino)-1-cyclohexenylacetonitrile, and
α-(n-butylsulfonyloxyimino)-1-cyclohexenylacetonitrile.

Suitable bisoxime sulfonates include those described in JP-A 9-208554, for example,
bis(α-(4-toluenesulfonyloxy)imino)-p-phenylenediacetonitrile,
bis(α-(benzenesulfonyloxy)imino)-p-phenylenediacetonitrile,
bis(α-(methanesulfonyloxy)imino)-p-phenylenediacetonitrile,
bis(α-(butanesulfonyloxy)imino)-p-phenylenediacetonitrile,
bis(α-(10-camphorsulfonyloxy)imino)-p-phenylenediacetonitrile,
bis(α-(4-toluenesulfonyloxy)imino)-p-phenylenediacetonitrile,
bis(α-(trifluoromethanesulfonyloxy)imino)-p-phenylenediacetonitrile,
bis(α-(4-methoxybenzenesulfonyloxy)imino)-p-phenylenediacetonitrile,
bis(α-(4-toluenesulfonyloxy)imino)-m-phenylenediacetonitrile,
bis(α-(benzenesulfonyloxy)imino)-m-phenylenediacetonitrile,
bis(α-(methanesulfonyloxy)imino)-m-phenylenediacetonitrile,
bis(α-(butanesulfonyloxy)imino)-m-phenylenediacetonitrile,
bis(α-(10-camphorsulfonyloxy)imino)-m-phenylenediacetonitrile,
bis(α-(4-toluenesulfonyloxy)imino)-m-phenylenediacetonitrile,
bis(α-(trifluoromethanesulfonyloxy)imino)-m-phenylenediacetonitrile,
bis(α-(4-methoxybenzenesulfonyloxy)imino)-m-phenylenediacetonitrile, etc.

Of the photoacid generators, sulfonium salts, bissulfonyldiazomethanes, N-sulfonyloxyimides and glyoxime derivatives are preferred, with the sulfonium salts, bissulfonyldiazomethanes, and N-sulfonyloxyimides being most preferred. Illustrative examples include triphenylsulfonium p-toluenesulfonate, triphenylsulfonium camphorsulfonate, triphenylsulfonium pentafluorobenzenesulfonate, triphenylsulfonium nonafluorobutanesulfonate, triphenylsulfonium 4-(4'-toluenesulfonyloxy)benzenesulfonate, triphenylsulfonium 2,4,6-triisopropylbenzenesulfonate, 4-tert-butoxyphenyldiphenylsulfonium p-toluenesulfonate, 4-tert-butoxyphenyldiphenylsulfonium camphorsulfonate, 4-tert-butoxyphenyldiphenylsulfonium 4-(4'-toluenesulfonyloxy)benzenesulfonate, tris(4-methylphenyl)sulfonium camphorsulfonate, tris(4-tert-butylphenyl)sulfonium camphorsulfonate, bis(tert-butylsulfonyl)diazomethane, bis(cyclohexylsulfonyl)diazomethane, bis(2,4-dimethylphenylsulfonyl)diazomethane, bis(4-(n-hexyloxy)phenylsulfonyl)diazomethane, bis(2-methyl-4-(n-hexyloxy)phenylsulfonyl)diazomethane, bis(2,5-dimethyl-4-(n-hexyloxy)phenylsulfonyl)diazomethane, bis(3,5-dimethyl-4-(n-hexyloxy)phenylsulfonyl)diazomethane, bis(2-methyl-5-isopropyl-4-(n-hexyloxy)phenylsulfonyl)-diazomethane, bis(4-tert-butylphenylsulfonyl)diazomethane, N-camphorsulfonyloxy-5-norbornene-2,3-dicarboxylic acid imide, and N-p-toluenesulfonyloxy-5-norbornene-2,3-dicarboxylic acid imide.

In the chemically amplified resist composition of the invention, the photoacid generator may be added in any desired amount, typically 0 to 10 parts, preferably 0.1 to 10 parts, and more preferably 0.2 to 5 parts by weight, per 100 parts by weight of the solids in the composition. Excessive amounts of the photoacid generator may degrade resolution and give rise to a problem of foreign matter during development and resist peeling. The photoacid generators may be used alone or in admixture. It is also possible to use a photoacid generator having a low transmittance at the exposure wavelength in a controlled amount so as to adjust the transmittance of a resist coating.

In the resist composition of the invention, there may be added a compound which is decomposed with an acid to generate another acid, that is, acid-propagating compound. For these compounds, reference should be made to J. Photopolym. Sci. and Tech., 8, 43–44, 45–46 (1995), and ibid., 9, 29–30 (1996).

Examples of the acid-propagating compound include tert-butyl 2-methyl-2-tosyloxymethylacetoacetate and 2-phenyl 2-(2-tosyloxyethyl)-1,3-dioxolane, but are not limited thereto. Of well-known photoacid generators, many of those compounds having poor stability, especially poor thermal stability exhibit an acid-propagating compound-like behavior.

In the resist composition of the invention, an appropriate amount of the acid-propagating compound is up to 2 parts, and especially up to 1 part by weight per 100 parts by weight of the solids in the composition. Excessive amounts of the acid-propagating compound makes diffusion control difficult, leading to degradation of resolution and pattern configuration.

The organic solvent (C) used herein may be any organic solvent in which the base resin, photoacid generator, and other components are soluble. Illustrative, non-limiting, examples of the organic solvent include ketones such as cyclohexanone and methyl 2-n-amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone. These solvents may be used alone or in combinations of two or more thereof. Of the above organic solvents, it is recommended to use diethylene glycol dimethyl ether, 1-ethoxy-2-propanol, propylene glycol monomethyl ether acetate, or a mixture thereof because the photoacid generator is most soluble therein.

An appropriate amount of the organic solvent used is about 200 to 1,000 parts, especially about 400 to 800 parts by weight per 100 parts by weight of the base resin.

The nitrogen containing organic compound used as component (D) is preferably a compound capable of suppressing the rate of diffusion when the acid generated by the photoacid generator diffuses within the resist film. The inclusion of this type of nitrogen containing organic compound holds down the rate of acid diffusion within the resist film, resulting in better resolution. In addition, it suppresses changes in sensitivity following exposure and reduces substrate and environment dependence, as well as improving the exposure latitude and the pattern profile.

Examples of nitrogen containing organic compounds include primary, secondary, and tertiary aliphatic amines, mixed amines, aromatic amines, heterocyclic amines, nitrogen compounds with carboxyl group, nitrogen compounds with sulfonyl group, nitrogen compounds with hydroxyl group, nitrogen compounds with hydroxyphenyl group, nitrogen containing alcohol compounds, amide derivatives, imide derivatives, and carbamate derivatives.

Examples of suitable primary aliphatic amines include ammonia, methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine. Examples of suitable aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridone, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable nitrogen compounds with carboxyl group include aminobenzoic acid, indolecarboxylic acid, and amino acid derivatives (e.g. nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of suitable nitrogen compounds with sulfonyl group include 3-pyridinesulfonic acid and pyridinium p-toluenesulfonate. Examples of suitable nitrogen compounds with hydroxyl group, nitrogen compounds with hydroxyphenyl group, and nitrogen containing alcohol compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide. Examples of suitable amide derivatives include formamide, N-methylformamide, N,N-dimethylformamide, acetamide, N-methylacetamide, N,N-dimethylacetamide, propionamide, benzamide, and 1-cyclohexylpyrrolidone. Suitable imide derivatives include phthalimide, succinimide, and maleimide. Suitable carbamate derivatives include N-t-butoxycarbonyl-N,N-dicyclohexylamine, N-t-butoxycarbonylbenzimidazole and oxazolidinone.

In addition, nitrogen containing organic compounds of the following general formula (B)-1 may also be included alone or in admixture.

$$N(X)_n(Y)_{3-n} \quad \text{(B)-1}$$

In the formula, n is equal to 1, 2 or 3; side chain Y is independently hydrogen or a straight, branched or cyclic alkyl group of 1 to 20 carbon atoms which may contain an ether or hydroxyl group; and side chain X is independently selected from groups of the following general formulas (X)-1 to (X)-3, and two or three X's may bond together to form a ring.

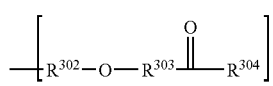  (X)-1

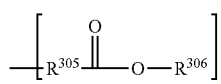  (X)-2

(X)-3

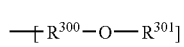

In the formulas, $R^{300}$, $R^{302}$ and $R^{305}$ are independently straight or branched alkylene groups of 1 to 4 carbon atoms; $R^{301}$ and $R^{304}$ are independently hydrogen, straight, branched or cyclic alkyl groups of 1 to 20 carbon atoms, which may contain at least one hydroxyl, ether, ester group or lactone ring; $R^{303}$ is a single bond or a straight or branched alkylene group of 1 to 4 carbon atoms; and $R^{306}$ is a straight, branched or cyclic alkyl group of 1 to 20 carbon atoms, which may contain at least one hydroxyl, ether, ester group or lactone ring.

Illustrative examples of the compounds of formula (B)-1 include tris(2-methoxymethoxyethyl)amine, tris{2-(2-methoxyethoxy)ethyl}amine, tris{2-(2-methoxyethoxymethoxy) ethyl}amine, tris{2-(1-methoxyethoxy)ethyl}amine, tris{2-(1-ethoxyethoxy)ethyl}amine, tris{2-(1-ethoxypropoxy) ethyl}amine, tris[2-(2-(2-hydroxyethoxy)ethoxy)ethyl] amine, 4,7,13,16,21,24-hexaoxa-1,10-diazabicyclo[8.8.8] hexacosane, 4,7,13,18-tetraoxa-1,10-diazabicyclo[8.5.5] eicosane, 1,4,10,13-tetraoxa-7,16-diazabicyclooctadecane, 1-aza-12-crown-4,1-aza-15-crown-5,1-aza-18-crown-6, tris (2-formyloxyethyl)amine, tris(2-acetoxyethyl)amine, tris(2-propionyloxyethyl)amine, tris(2-butyryloxyethyl)amine, tris (2-isobutyryloxyethyl)amine, tris(2-valeryloxyethyl)amine, tris(2-pivaloyloxyethyl)amine, N,N-bis(2-acetoxyethyl)-2-(acetoxyacetoxy)ethylamine, tris(2-methoxycarbonyloxyethyl)amine, tris(2-tert-butoxycarbonyloxyethyl)amine, tris [2-(2-oxopropoxy)ethyl]amine, tris[2-(methoxycarbonylmethyl)oxyethyl]amine, tris[2-(tert-butoxycarbonylmethyloxy)ethyl]amine, tris[2-(cyclohexyloxycarbonylmethyloxy)ethyl]amine, tris(2-methoxycarbonylethyl)amine, tris(2-ethoxycarbonylethyl) amine, N,N-bis(2-hydroxyethyl)-2-(methoxycarbonyl) ethylamine, N,N-bis(2-acetoxyethyl)-2-(methoxycarbonyl) ethylamine, N,N-bis(2-hydroxyethyl)-2-(ethoxycarbonyl) ethylamine, N,N-bis(2-acetoxyethyl)-2-(ethoxycarbonyl) ethylamine, N,N-bis(2-hydroxyethyl)-2-(2-methoxyethoxycarbonyl)ethylamine, N,N-bis(2-acetoxyethyl)-2-(2-methoxyethoxycarbonyl)ethylamine, N,N-bis(2-hydroxyethyl)-2-(2-hydroxyethoxycarbonyl) ethylamine, N,N-bis(2-acetoxyethyl)-2-(2-acetoxyethoxycarbonyl)ethylamine, N,N-bis(2-hydroxyethyl)-2-[(methoxycarbonyl)methoxycarbonyl]-ethylamine, N,N-bis(2-acetoxyethyl)-2-[(methoxycarbonyl)methoxycarbonyl]-ethylamine, N,N-bis(2-hydroxyethyl)-2-(2-oxopropoxycarbonyl)ethylamine, N,N-bis(2-acetoxyethyl)-2-(2-oxopropoxycarbonyl)ethylamine, N,N-bis(2-hydroxyethyl)-2-(tetrahydrofurfuryloxycarbonyl)-ethylamine, N,N-bis(2-acetoxyethyl)-2-(tetrahydrofurfuryloxycarbonyl)-ethylamine, N,N-bis(2-hydroxyethyl)-2-[(2-oxotetrahydrofuran-3-yl)oxycarbonyl] ethylamine, N,N-bis(2-acetoxyethyl)-2-[(2-oxotetrahydrofuran-3-yl)oxycarbonyl]ethylamine, N,N-bis (2-hydroxyethyl)-2-(4-hydroxybutoxycarbonyl)ethylamine, N,N-bis(2-formyloxyethyl)-2-(4-formyloxybutoxycarbonyl)-ethylamine, N,N-bis(2-formyloxyethyl)-2-(2-formyloxyethoxycarbonyl)-ethylamine, N,N-bis(2-methoxyethyl)-2-(methoxycarbonyl)ethylamine, N-(2-hydroxyethyl)-bis[2-(methoxycarbonyl)ethyl]amine, N-(2-acetoxyethyl)-bis[2-(methoxycarbonyl)ethyl]amine, N-(2-hydroxyethyl)-bis[2-(ethoxycarbonyl)ethyl]amine, N-(2-acetoxyethyl)-bis[2-(ethoxycarbonyl)ethyl]amine, N-(3-hydroxy-1-propyl)-bis[2-(methoxycarbonyl)ethyl]amine, N-(3-acetoxy-1-propyl)-bis[2-(methoxycarbonyl)ethyl] amine, N-(2-methoxyethyl)-bis[2-(methoxycarbonyl)ethyl] amine, N-butyl-bis[2-(methoxycarbonyl)ethyl]amine, N-butyl-bis[2-(2-methoxyethoxycarbonyl)ethyl]amine, N-methyl-bis(2-acetoxyethyl)amine, N-ethyl-bis(2-acetoxyethyl)amine, N-methyl-bis(2-pivaloyloxyethyl)amine, N-ethyl-bis[2-(methoxycarbonyloxy)ethyl]amine, N-ethyl-bis[2-(tert-butoxycarbonyloxy)ethyl]amine, tris(methoxycarbonylmethyl)amine, tris(ethoxycarbonylmethyl)amine, N-butyl-bis(methoxycarbonylmethyl)amine, N-hexyl-bis (methoxycarbonylmethyl)amine, and β-(diethylamino)-δ-valerolactone.

Also useful are one or more cyclic structure-bearing nitrogen containing organic compounds having the following general formula (B)-2.

  (B)-2

Herein X is as defined above, and $R^{307}$ is a straight or branched alkylene group of 2 to 20 carbon atoms which may contain one or more carbonyl, ether, ester or sulfide groups.

Illustrative examples of the cyclic structure-bearing nitrogen containing organic compounds having formula (B)-2 include 1-[2-(methoxymethoxy)ethyl]pyrrolidine, 1-[2-(methoxymethoxy)ethyl]piperidine, 4-[2-(methoxymethoxy)ethyl]morpholine, 1-[2-[(2-methoxyethoxy) methoxy]ethyl]pyrrolidine, 1-[2-[(2-methoxyethoxy) methoxy]ethyl]piperidine, 4-[2-[(2-methoxyethoxy) methoxy]ethyl]morpholine, 2-(1-pyrrolidinyl)ethyl acetate, 2-piperidinoethyl acetate, 2-morpholinoethyl acetate, 2-(1- pyrrolidinyl)ethyl formate, 2-piperidinoethyl propionate, 2-morpholinoethyl acetoxyacetate, 2-(1-pyrrolidinyl)ethyl methoxyacetate, 4-[2-(methoxycarbonyloxy)ethyl]morpholine, 1-[2-(t-butoxycarbonyloxy)ethyl]piperidine, 4-[2-(2-methoxyethoxycarbonyloxy)ethyl]morpholine, methyl 3-(1-pyrrolidinyl)propionate, methyl 3-piperidinopropionate, methyl 3-morpholinopropionate, methyl 3-(thiomorpholino) propionate, methyl 2-methyl-3-(1-pyrrolidinyl)propionate, ethyl 3-morpholinopropionate, methoxycarbonylmethyl 3-piperidinopropionate, 2-hydroxyethyl 3-(1-pyrrolidinyl) propionate, 2-acetoxyethyl 3-morpholinopropionate, 2-oxotetrahydrofuran-3-yl 3-(1-pyrrolidinyl)propionate, tetrahydrofurfuryl 3-morpholinopropionate, glycidyl 3-piperidinopropionate, 2-methoxyethyl 3-morpholinopropionate, 2-(2-methoxyethoxy)ethyl 3-(1-pyrrolidinyl)propionate, butyl 3-morpholinopropionate, cyclohexyl 3-piperidinopropionate, α-(1-pyrrolidinyl)methyl-γ-butyrolactone, β-piperidino-γ-butyrolactone, β-morpholino-δ-valerolactone, methyl 1-pyrrolidinylacetate, methyl piperidinoacetate, methyl morpholinoacetate, methyl thiomorpholinoacetate, ethyl 1-pyrrolidinylacetate, and 2-methoxyethyl morpholinoacetate.

Also, one or more of cyano-bearing nitrogen containing organic compounds having the following general formulae (B)-3 to (B)-6 may be blended.

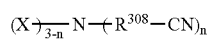
(B)-3

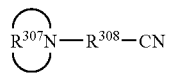
(B)-4

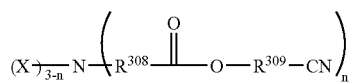
(B)-5

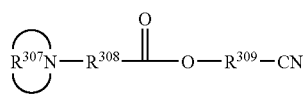
(B)-6

Herein, X, $R^{307}$ and n are as defined above, and $R^{308}$ and $R^{309}$ are each independently a straight or branched alkylene group of 1 to 4 carbon atoms.

Illustrative examples of the cyano-bearing nitrogen containing organic compounds having formulae (B)-3 to (B)-6 include 3-(diethylamino)propiononitrile, N,N-bis(2-hydroxyethyl)-3-aminopropiononitrile, N,N-bis(2-acetoxyethyl)-3-aminopropiononitrile, N,N-bis(2-formyloxyethyl)-3-aminopropiononitrile, N,N-bis(2-methoxyethyl)-3-aminopropiononitrile, N,N-bis[2-(methoxymethoxy)ethyl]-3-aminopropiononitrile, methyl N-(2-cyanoethyl)-N-(2-methoxyethyl)-3-aminopropionate, methyl N-(2-cyanoethyl)-N-(2-hydroxyethyl)-3-aminopropionate, methyl N-(2-acetoxyethyl)-N-(2-cyanoethyl)-3-aminopropionate, N-(2-cyanoethyl)-N-ethyl-3-aminopropiononitrile, N-(2-cyanoethyl)-N-(2-hydroxyethyl)-3-aminopropiononitrile, N-(2-acetoxyethyl)-N-(2-cyanoethyl)-3-aminopropiononitrile, N-(2-cyanoethyl)-N-(2-formyloxyethyl)-3-aminopropiononitrile, N-(2-cyanoethyl)-N-(2-methoxyethyl)-3-aminopropiononitrile, N-(2-cyanoethyl)-N-[2-(methoxymethoxy)ethyl]-3-aminopropiononitrile, N-(2-cyanoethyl)-N-(3-hydroxy-1-propyl)-3-aminopropiononitrile, N-(3-acetoxy-1-propyl)-N-(2-cyanoethyl)-3-aminopropiononitrile, N-(2-cyanoethyl)-N-(3-formyloxy-1-propyl)-3-aminopropiononitrile, N-(2-cyanoethyl)-N-tetrahydrofurfuryl-3-aminopropiononitrile, N,N-bis(2-cyanoethyl)-3-aminopropiononitrile, diethylaminoacetonitrile, N,N-bis(2-hydroxyethyl)aminoacetonitrile, N,N-bis(2-acetoxyethyl)aminoacetonitrile, N,N-bis(2-formyloxyethyl)aminoacetonitrile, N,N-bis(2-methoxyethyl)aminoacetonitrile, N,N-bis[2-(methoxymethoxy)ethyl]aminoacetonitrile, methyl N-cyanomethyl-N-(2-methoxyethyl)-3-aminopropionate, methyl N-cyanomethyl-N-(2-hydroxyethyl)-3-aminopropionate, methyl N-(2-acetoxyethyl)-N-cyanomethyl-3-aminopropionate, N-cyanomethyl-N-(2-hydroxyethyl)aminoacetonitrile, N-(2-acetoxyethyl)-N-(cyanomethyl)aminoacetonitrile, N-cyanomethyl-N-(2-formyloxyethyl)aminoacetonitrile, N-cyanomethyl-N-(2-methoxyethyl)aminoacetonitrile, N-cyanomethyl-N-[2-(methoxymethoxy)ethyl]aminoacetonitrile, N-cyanomethyl-N-(3-hydroxy-1-propyl)aminoacetonitrile, N-(3-acetoxy-1-propyl)-N-(cyanomethyl)aminoacetonitrile, N-cyanomethyl-N-(3-formyloxy-1-propyl)aminoacetonitrile, N,N-bis(cyanomethyl)aminoacetonitrile, 1-pyrrolidinepropiononitrile, 1-piperidinepropiononitrile, 4-morpholinepropiononitrile, 1-pyrrolidineacetonitrile, 1-piperidineacetonitrile, 4-morpholineacetonitrile, cyanomethyl 3-diethylaminopropionate, cyanomethyl N,N-bis(2-hydroxyethyl)-3-aminopropionate, cyanomethyl N,N-bis(2-acetoxyethyl)-3-aminopropionate, cyanomethyl N,N-bis(2-formyloxyethyl)-3-aminopropionate, cyanomethyl N,N-bis(2-methoxyethyl)-3-aminopropionate, cyanomethyl N,N-bis[2-(methoxymethoxy)ethyl]-3-aminopropionate, 2-cyanoethyl 3-diethylaminopropionate, 2-cyanoethyl N,N-bis(2-hydroxyethyl)-3-aminopropionate, 2-cyanoethyl N,N-bis(2-acetoxyethyl)-3-aminopropionate, 2-cyanoethyl N,N-bis(2-formyloxyethyl)-3-aminopropionate, 2-cyanoethyl N,N-bis(2-methoxyethyl)-3-aminopropionate, 2-cyanoethyl N,N-bis[2-(methoxymethoxy)ethyl]-3-aminopropionate, cyanomethyl 1-pyrrolidinepropionate, cyanomethyl 1-piperidinepropionate, cyanomethyl 4-morpholinepropionate, 2-cyanoethyl 1-pyrrolidinepropionate, 2-cyanoethyl 1-piperidinepropionate, and 2-cyanoethyl 4-morpholinepropionate.

Also included are nitrogen containing organic compounds having an imidazole skeleton and a polar functional group, represented by the general formula (B)-7.

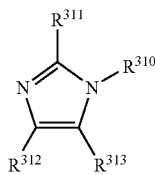
(B)-7

Herein, $R^{310}$ is a straight, branched or cyclic alkyl group of 2 to 20 carbon atoms bearing at least one polar functional group selected from among hydroxyl, carbonyl, ester, ether, sulfide, carbonate, cyano and acetal groups; $R^{311}$, $R^{312}$ and $R^{313}$ are each independently a hydrogen atom, a straight, branched or cyclic alkyl group, aryl group or aralkyl group having 1 to 10 carbon atoms.

Also included are nitrogen containing organic compounds having a benzimidazole skeleton and a polar functional group, represented by the general formula (B)-8.

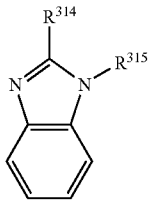
(B)-8

Herein, $R^{314}$ is a hydrogen atom, a straight, branched or cyclic alkyl group, aryl group or aralkyl group having 1 to 10 carbon atoms. $R^{315}$ is a polar functional group-bearing, straight, branched or cyclic alkyl group of 1 to 20 carbon atoms, and the alkyl group contains as the polar functional group at least one group selected from among ester, acetal and cyano groups, and may additionally contain at least one group selected from among hydroxyl, carbonyl, ether, sulfide and carbonate groups.

Further included are heterocyclic nitrogen compounds having a polar functional group, represented by the general formulae (B)-9 and (B)-10.

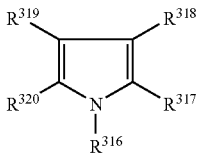
(B)-9

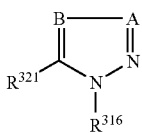
(B)-10

Herein, A is a nitrogen atom or ≡C—$R^{322}$, B is a nitrogen atom or ≡C—$R^{323}$, $R^{316}$ is a straight, branched or cyclic alkyl group of 2 to 20 carbon atoms bearing at least one polar functional group selected from among hydroxyl, carbonyl, ester, ether, sulfide, carbonate, cyano and acetal groups; $R^{317}$, $R^{318}$, $R^{319}$ and $R^{320}$ are each independently a hydrogen atom, a straight, branched or cyclic alkyl group or aryl group having 1 to 10 carbon atoms, or a pair of $R^{317}$ and $R^{318}$ and a pair of $R^{319}$ and $R^{320}$, taken together, may form a benzene, naphthalene or pyridine ring; $R^{321}$ is a hydrogen atom, a straight, branched or cyclic alkyl group or aryl group having 1 to 10 carbon atoms; $R^{322}$ and $R^{323}$ each are a hydrogen atom, a straight, branched or cyclic alkyl group or aryl group having 1 to 10 carbon atoms, or a pair of $R^{321}$ and $R^{323}$, taken together, may form a benzene or naphthalene ring.

The nitrogen containing organic compounds may be used alone or in admixture of two or more. The nitrogen containing organic compound is preferably formulated in an amount of 0.001 to 2 parts, and especially 0.01 to 1 part by weight, per 100 parts by weight of the entire base resin. Less than 0.001 part of the nitrogen containing organic compound achieves no or little addition effect whereas more than 2 parts would result in too low a sensitivity.

While the resist composition of the invention is basically composed of the inventive polymer, the photoacid generator, the organic solvent and the nitrogen containing organic compound as described above, it may further include any well-known components such as dissolution inhibitors, acidic compounds, stabilizers, dyes, and surfactants, if necessary. Such optional components are added in any desired amounts insofar as the benefits of the invention are not impaired.

Of these, surfactants are often used for improving the coating characteristics. Nonionic surfactants are preferred, examples of which include perfluoroalkylpolyoxyethylene ethanols, fluorinated alkyl esters, perfluoroalkylamine oxides, perfluoroalkyl EO-addition products, and fluorinated organosiloxane compounds. Useful surfactants are commercially available under the trade names Fluorad FC-430 and FC-431 from Sumitomo 3M Co., Ltd., Surflon S-141 and S-145, KH-10, KH-20, KH-30 and KH-40 from Asahi Glass Co., Ltd., Unidyne DS-401, DS-403 and DS-451 from Daikin Industry Co., Ltd., Megaface F-8151 from Dainippon Ink & Chemicals, Inc., and X-70-092 and X-70-093 from Shin-Etsu Chemical Co., Ltd. Preferred surfactants are Fluorad FC-430 from Sumitomo 3M Co., Ltd., KH-20, KH-30 from Asahi Glass Co., Ltd., and X-70-093 from Shin-Etsu Chemical Co., Ltd.

Pattern formation using the resist composition of the invention may be carried out by a known lithographic technique. For example, the resist composition is applied onto a substrate such as a silicon wafer by spin coating or the like to form a resist film having a thickness of 0.3 to 2.0 μm, which is then pre-baked on a hot plate at 60 to 150° C. for 1 to 10 minutes, and preferably at 80 to 140° C. for 1 to 5 minutes. A patterning mask having the desired pattern is then placed over the resist film, and the film exposed through the mask to an electron beam or to high-energy radiation such as deep-UV rays, an excimer laser, or x-rays in a dose of about 1 to 200 mJ/cm$^2$, and preferably about 10 to 100 mJ/cm$^2$. Light exposure may be done by a conventional exposure process or in some cases, by an immersion process of providing liquid impregnation between the mask and the resist. The resist film is then post-exposure baked (PEB) on a hot plate at 60 to 150° C. for 1 to 5 minutes, and preferably at 80 to 140° C. for 1 to 3 minutes. Finally, development is carried out using as the developer an aqueous alkali solution, such as a 0.1 to 5% (preferably 2 to 3%) aqueous solution of tetramethylammonium hydroxide (TMAH), this being done by a conventional method such as dipping, puddling, or spraying for a period of 0.1 to 3 minutes, and preferably 0.5 to 2 minutes. These steps result in the formation of the desired pattern on the substrate. Of the various types of high-energy radiation that may be used, the resist composition of the invention is best suited to fine pattern formation with, in particular, deep-UV rays having a wavelength of 250 to 190 nm, an excimer laser, x-rays, or an electron beam. The desired pattern may not be obtainable outside the upper and lower limits of the above range.

EXAMPLE

Examples of the invention are given below by way of illustration and not by way of limitation.

Polymers within the scope of the invention were synthesized according to the method shown below.

Synthesis Example 1

Synthesis of Polymer 1

In a nitrogen atmosphere, a mixture of 7.1 g of Monomer 1, 2.3 g of Monomer 2, 6.7 g of Monomer 3, 6.7 g of Monomer 4, 690 mg of a polymerization initiator V-601 (Wako Junyaku Co., Ltd.), and 50 ml of 2-butanone was heated and stirred at 80° C. for 10 hours. The reaction mixture was allowed to cool down and thereafter, added dropwise to 300 g of hexane, with vigorous stirring. A precipitate settled out and was separated by filtration. The solids thus obtained were washed with hexane and dried in vacuum, obtaining 20.5 g of the target polymer. The yield was 90%. An integration ratio computed from a $^{13}$C-NMR spectrum indicated an approximate copolymerization ratio of 30:10:30:30. The polymer had a weight average molecular weight (Mw) of 8,600 as measured by gel permeation chromatography (GPC) using polystyrene standards, and a polydispersity index (Mw/Mn) of 1.85.

The reaction scheme is shown below.

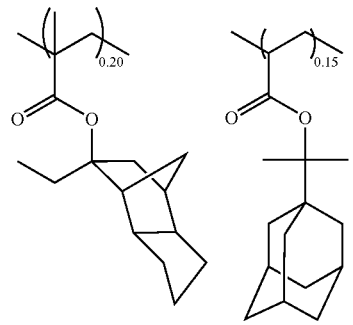

Polymer-2

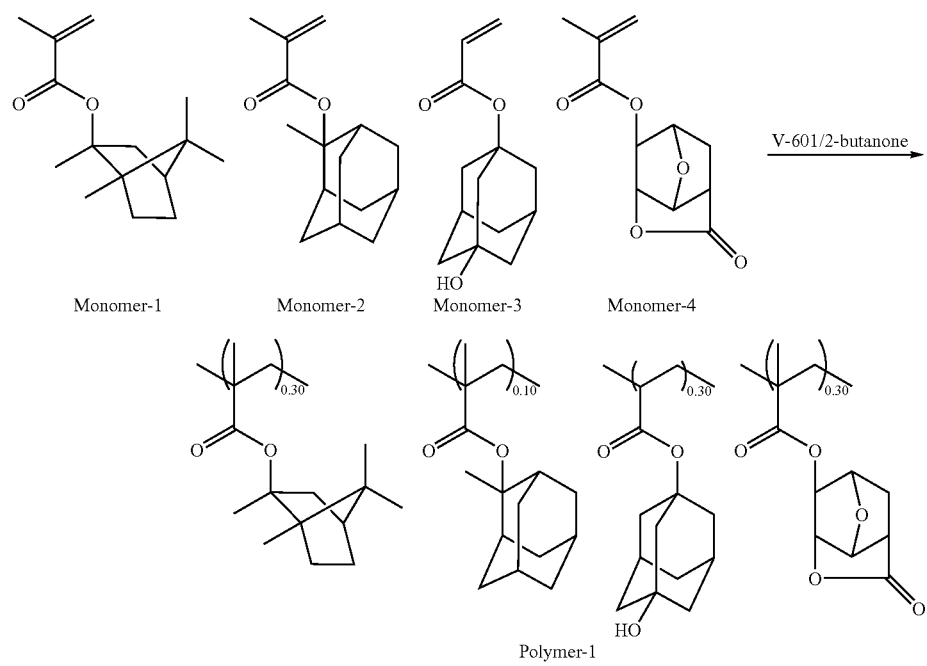

Synthesis Examples 2–10 & Comparative Synthesis Examples 1–6

Synthesis of Polymers 2 to 16

Polymers 2 to 16 were synthesized as in Synthesis Example 1 except that acrylates or methacrylates corresponding to the respective recurring units were used in amounts proportional to a copolymerization ratio.

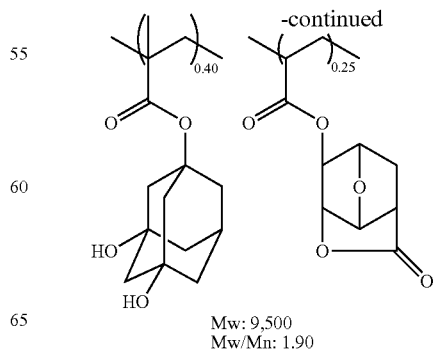

-continued

Mw: 9,500
Mw/Mn: 1.90

-continued
Polymer-3
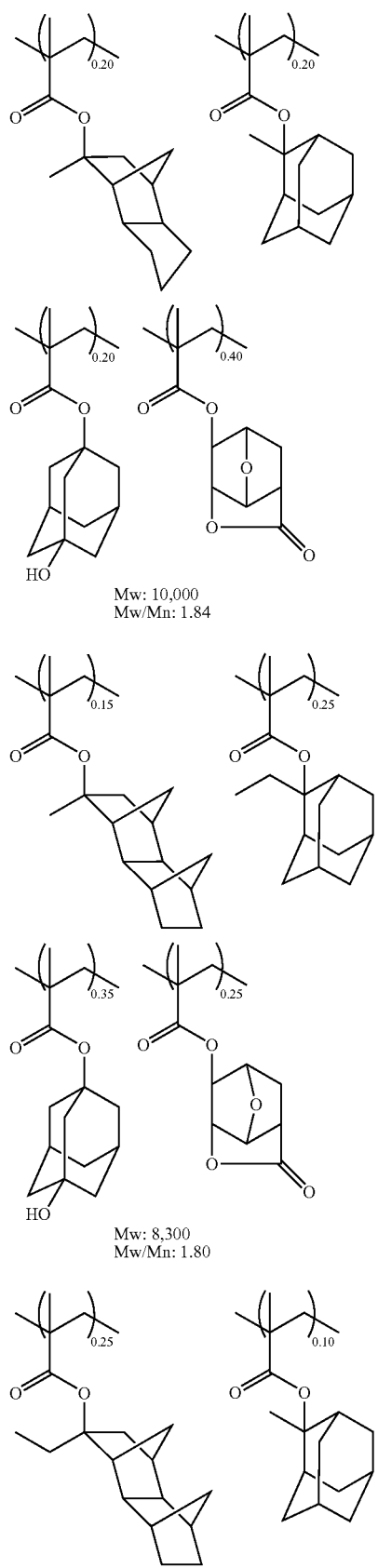
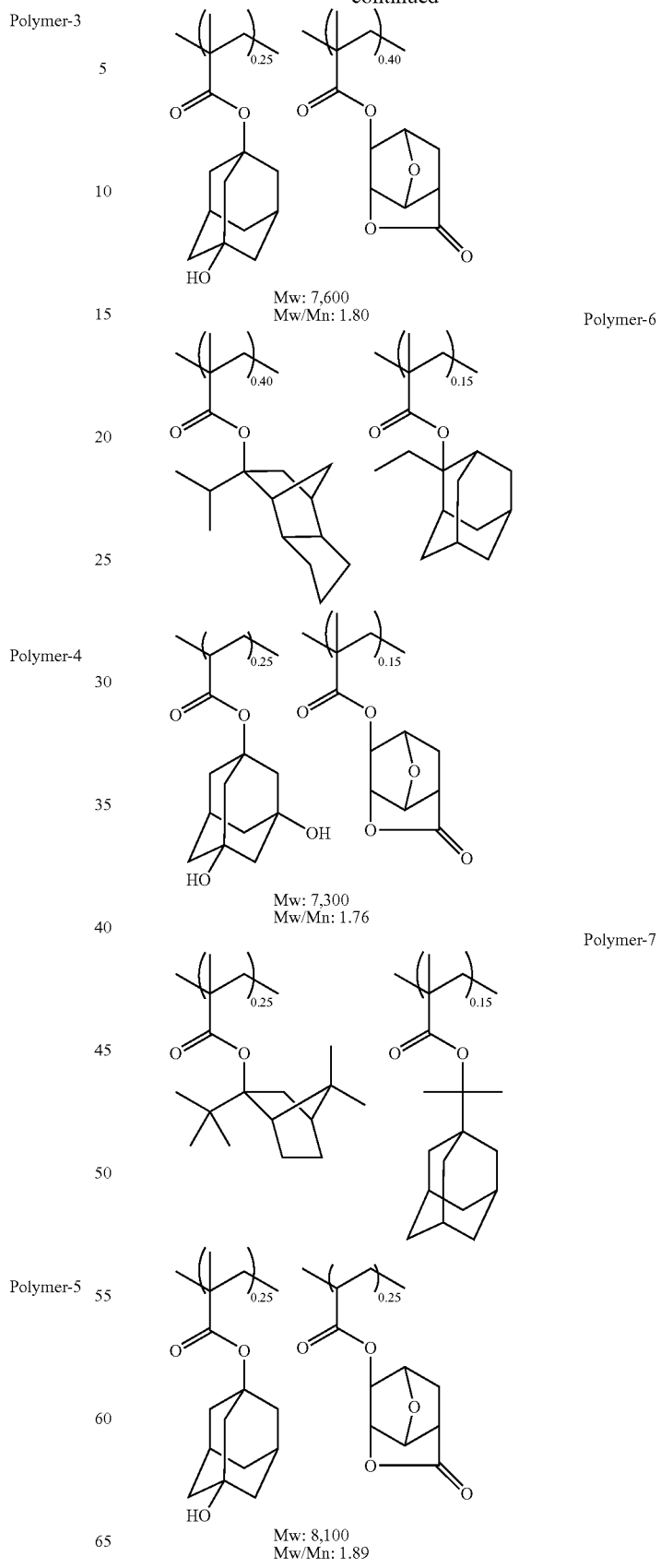

-continued
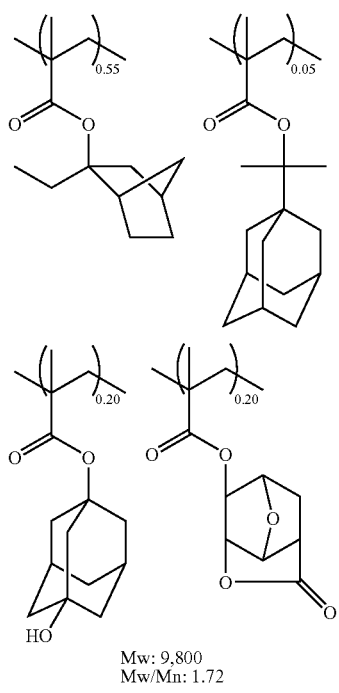
Mw: 9,800
Mw/Mn: 1.72
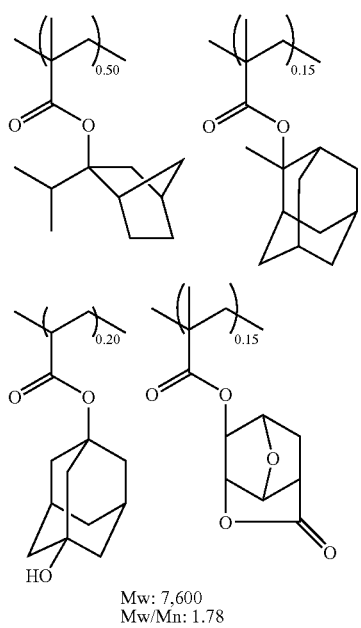
Mw: 7,600
Mw/Mn: 1.78
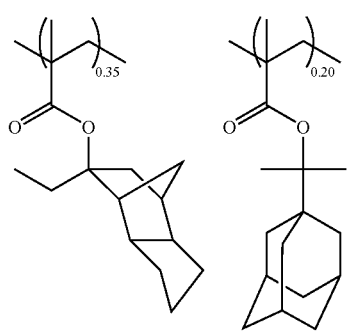
Polymer-8
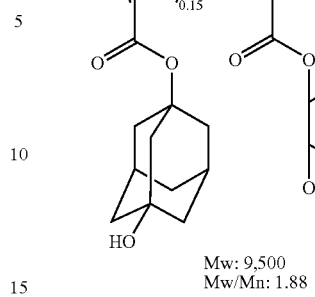
Mw: 9,500
Mw/Mn: 1.88
Polymer-9
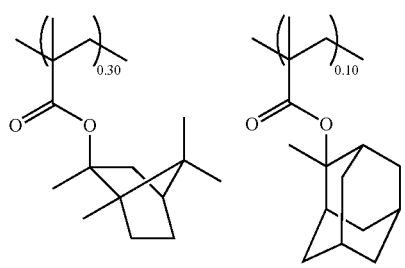
Mw: 7,700
Mw/Mn: 1.79
Polymer-10
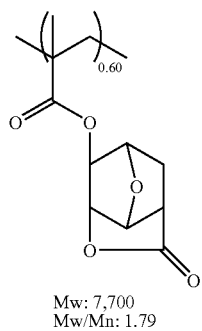
Polymer-11
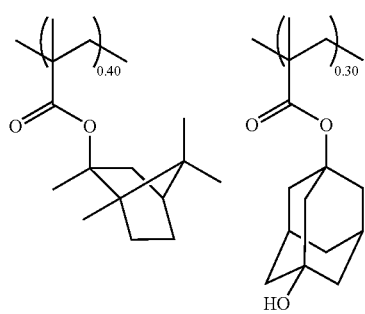
Polymer-12
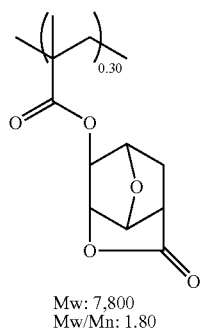
Mw: 7,800
Mw/Mn: 1.80

-continued

Polymer-13

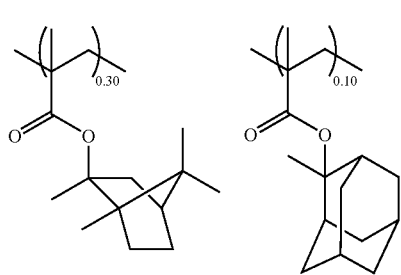

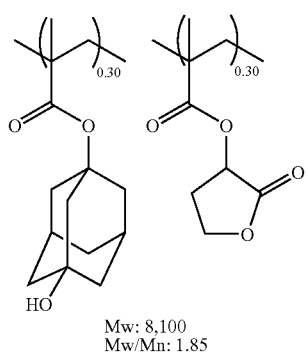

Mw: 8,100
Mw/Mn: 1.85

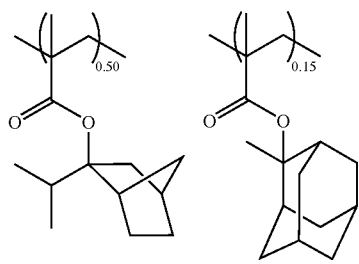

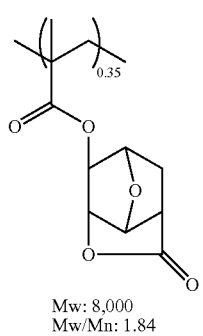

Mw: 8,000
Mw/Mn: 1.84

Polymer-15

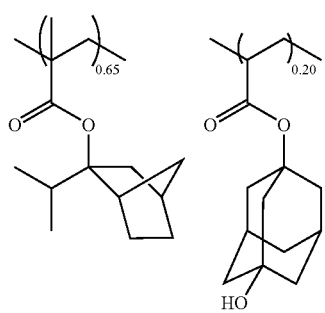

-continued

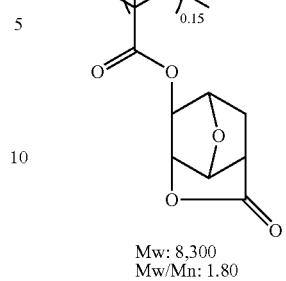

Mw: 8,300
Mw/Mn: 1.80

Polymer-16

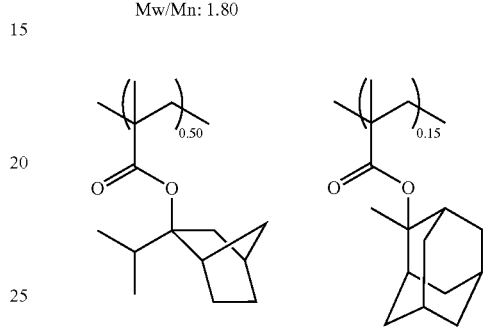

Polymer-14

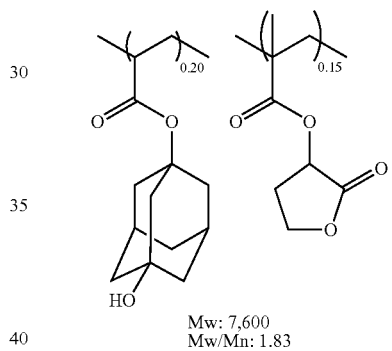

Mw: 7,600
Mw/Mn: 1.83

A series of resist materials having the inventive polymers formulated as a base resin were prepared. The resist materials were processed by the patterning process of the invention and assayed for resolution and proximity bias.

Example 1

Using Polymer 1 obtained in Synthesis Example 1, a resist material was prepared according to the composition:

(A) 80 parts by weight of Polymer 1 as the base resin,
(B) 2.0 parts by weight of triphenylsulfonium nonafluorobutanesulfonate as the photoacid generator,
(C) 640 parts by weight of propylene glycol monomethyl ether acetate as the solvent, and
(D) 0.25 part by weight of triethanolamine as the nitrogen containing organic compound.

This was passed through a Teflon® filter having a pore diameter of 0.2 µm.

The resist material was spin coated on a silicon wafer having an antireflective coating (ARC29A by Nissan Chemical Co., Ltd., 78 nm) coated thereon and heat treated at 130° C. for 60 seconds, forming a resist film of 300 nm thick. The resist film was exposed to light in an ArF excimer laser stepper (Nikon Corp., NA=0.68), heat treated at 115° C. for 60 seconds, cooled down to 23° C., and puddle developed in a 2.38% aqueous solution of tetramethylammonium hydroxide at 23° C. for 60 seconds, thereby forming a 1:1 line-and-space pattern. The wafer as developed was observed under top-down SEM. At the exposure (optimum exposure) which provided a 1:1 resolution of a 0.120-μm line-and-space pattern, a 1:5 line-and-space pattern resulting from exposure through a mask having the same line size had a line width of 0.100 μm. That is, a proximity bias between 1:1 pattern and 1:5 pattern was 0.020 μm.

Examples 2–5 & Comparative Examples 1–3

As in Example 1, resist materials were prepared using Polymers 2 to 5 and Polymers 11 to 13 obtained in Synthesis Examples 2–5 and Comparative Synthesis Examples 1–3, and evaluated for resolution and proximity bias.

Based on the test results, the resist materials are rated "OK" or "NG" with respect to whether or not a 0.12-μm line-and-space pattern could be resolved. Values for the proximity bias between 1:1 pattern and 1:5 pattern are also shown in Table 1.

TABLE 1

| Example | Base polymer | 0.12 μm L/S pattern resolution | Proximity bias (μm) |
|---|---|---|---|
| Example 1 | Polymer 1 | OK | 0.020 |
| Example 2 | Polymer 2 | OK | 0.022 |
| Example 3 | Polymer 3 | OK | 0.019 |
| Example 4 | Polymer 4 | OK | 0.023 |
| Example 5 | Polymer 5 | OK | 0.021 |
| Comparative Example 1 | Polymer 11 | OK | 0.051 |
| Comparative Example 2 | Polymer 12 | OK | 0.042 |
| Comparative Example 3 | Polymer 13 | OK | 0.040 |

Example 6

Using Polymer 6 obtained in Synthesis Example 6, a resist material was prepared according to the composition:

(A) 80 parts by weight of Polymer 6 as the base resin,
(B) 2.0 parts by weight of triphenylsulfonium nonafluorobutanesulfonate as the photoacid generator,
(C) 640 parts by weight of propylene glycol monomethyl ether acetate as the solvent, and
(D) 0.12 part by weight of triethanolamine as the nitrogen containing organic compound.

This was passed through a Teflon® filter having a pore diameter of 0.2 μm.

The resist material was spin coated on a silicon wafer having an antireflective coating (ARC29A by Nissan Chemical Co., Ltd., 78 nm) coated thereon and heat treated at 105° C. for 60 seconds, forming a resist film of 295 nm thick. The resist film was exposed to light in an ArF excimer laser stepper (Nikon Corp., NA=0.68), heat treated at 125° C. for 60 seconds, cooled down to 23° C., and puddle developed in a 2.38% aqueous solution of tetramethylammonium hydroxide at 23° C. for 60 seconds, thereby forming a 1:1 densely packed contact hole pattern. The wafer as developed was observed under top-down SEM. At the exposure (optimum exposure) which provided a resolution of a 1:1 dense contact hole pattern having a hole diameter of 0.150 μm, a 1:5 contact hole pattern resulting from exposure through a mask having the same hole size had a hole diameter of 0.135 μm. That is, a proximity bias between 1:1 pattern and 1:5 pattern was 0.015 μm.

Examples 7–10 & Comparative Examples 4–6

As in Example 6, resist materials were prepared using Polymers 7 to 10 and Polymers 14 to 16 obtained in Synthesis Examples 7–10 and Comparative Synthesis Examples 4–6, and evaluated for resolution and proximity bias.

Based on the test results, the resist materials are rated "OK" or "NG" with respect to whether or not a 1:1 dense contact hole pattern having a hole diameter of 0.150 μm could be resolved. Values for the proximity bias between 1:1 pattern and 1:5 pattern are also shown in Table 2.

TABLE 2

| Example | Base polymer | 0.15 μm pattern resolution | Proximity bias (μm) |
|---|---|---|---|
| Example 6 | Polymer 6 | OK | 0.015 |
| Example 7 | Polymer 7 | OK | 0.016 |
| Example 8 | Polymer 8 | OK | 0.014 |
| Example 9 | Polymer 9 | OK | 0.013 |
| Example 10 | Polymer 10 | OK | 0.016 |
| Comparative Example 4 | Polymer 14 | OK | 0.035 |
| Comparative Example 5 | Polymer 15 | OK | 0.032 |
| Comparative Example 6 | Polymer 16 | OK | 0.030 |

It is evident from Tables 1 and 2 that the resist compositions within the scope of the invention satisfy both high resolution and minimized proximity bias when processed through ArF excimer laser exposure.

Japanese Patent Application No. 2003-288844 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A polymer which increases a dissolution rate in an alkali developer under the action of an acid, the polymer comprising recurring units having the general formulae (1), (2), (3) and (4), the recurring units being of at least one type for each formula,

(1)

(2)

-continued

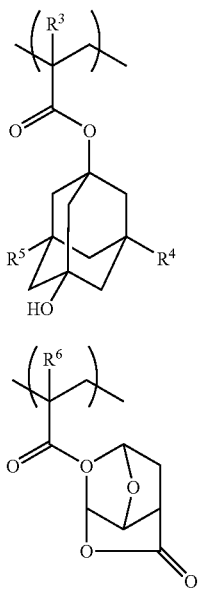

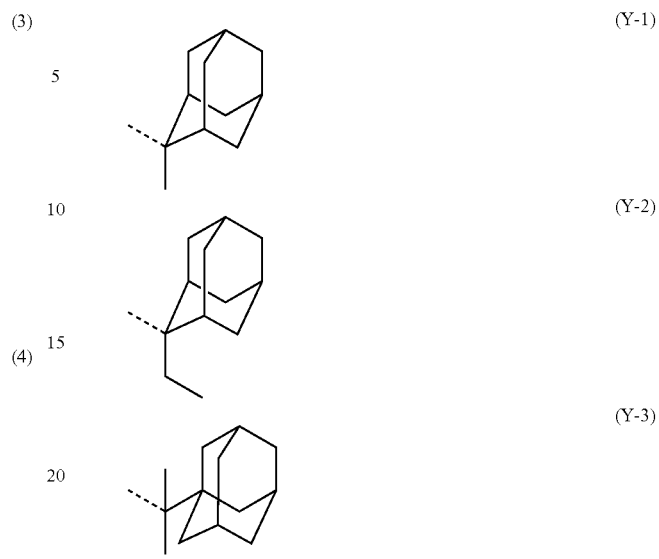

wherein $R^1$, $R^2$, $R^3$ and $R^6$ are each independently hydrogen or methyl, $R^4$ and $R^5$ are each independently hydrogen or hydroxyl, X is a tertiary exo-alkyl group having a bicyclo[2.2.1]heptane framework, represented by any of the general formulae (X-1) to (X-4):

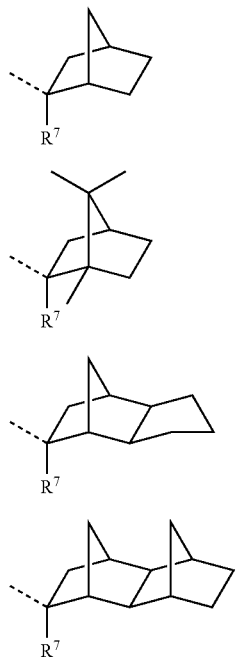

wherein $R^7$ is a straight, branched or cyclic alkyl group having 1 to 10 carbon atoms, and a broken line depicts a bonding position and a bonding direction, and Y is a tertiary alkyl group having an adamantane structure.

2. The polymer of claim 1, wherein Y in the recurring units of formula (2) has any one of the formulae (Y-1) to (Y-3):

wherein a broken line depicts a bonding position.

3. The polymer of claim 1, wherein the polymer has a weight average molecular weight of 1,000 to 50,000, and the molar fractions of the recurring units of formulae (1), (3) and (4) each are at least 5%, and the molar fraction of the recurring units of formula (2) is at least 2%.

4. A resist composition comprising the polymer of claim 1.

5. A process for forming a resist pattern comprising the steps of:
   applying the resist composition of claim 4 onto a substrate to form a coating,
   heat treating the coating and then exposing it to high-energy radiation having a wavelength of up to 300 nm or electron beams through a photomask, and
   heat treating the exposed coating and developing it with a developer.

6. A resist composition comprising
   (A) the polymer of claim 1,
   (B) a photoacid generator, and
   (C) an organic solvent.

7. A resist composition comprising
   (A) the polymer of claim 1,
   (B) a photoacid generator,
   (C) an organic solvent, and
   (D) a nitrogen containing organic compound.

8. The polymer of claim 1, wherein the molar fraction of recurring units of formula (1) is from 10% to less than 70%, the molar fraction of recurring units of formula (2) is from 2% to less than 60%, the molar fraction of recurring units of formula (3) is from 10% to less than 60%, and the molar fraction of recurring units of formula (4) is from 10% to less than 60%.

9. The polymer of claim 1, which is selected from the group consisting of polymers each of which comprising the recurring units of the following formulae:

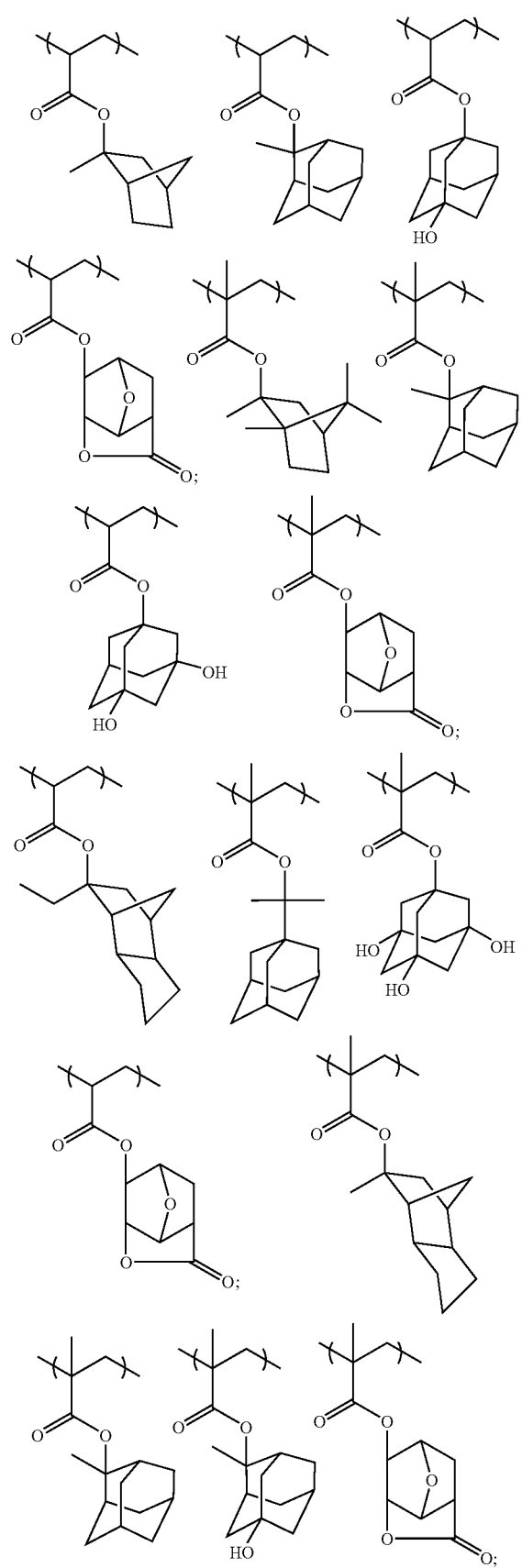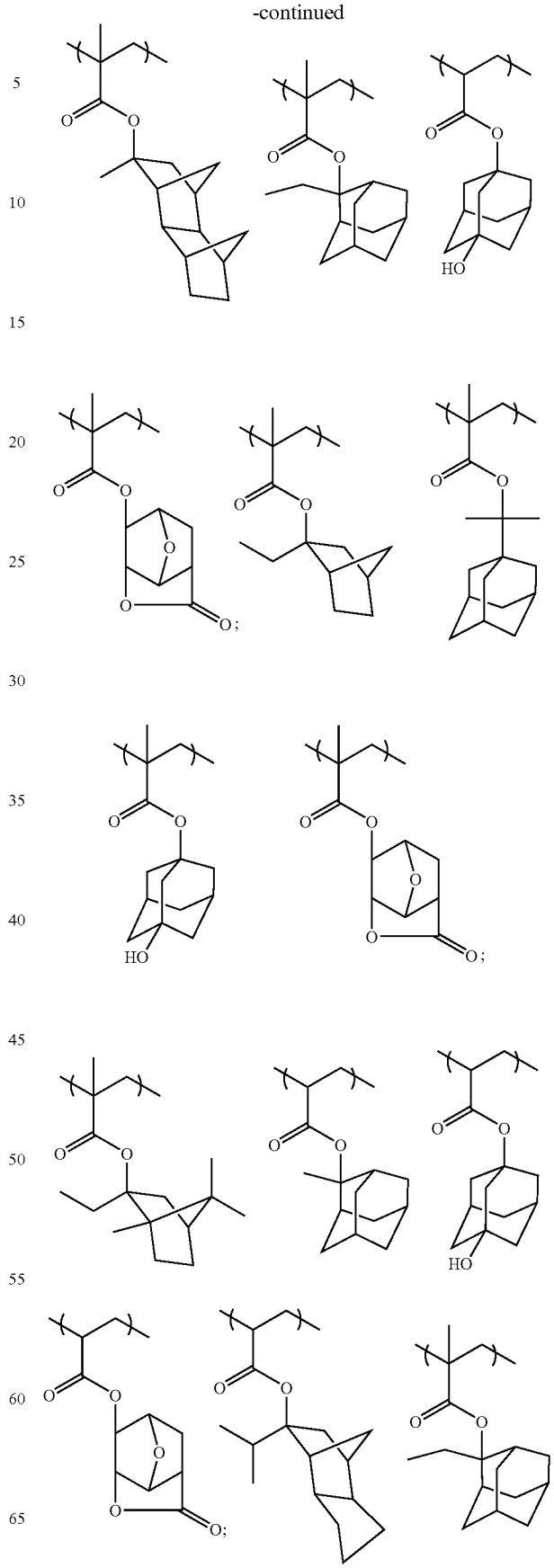

-continued

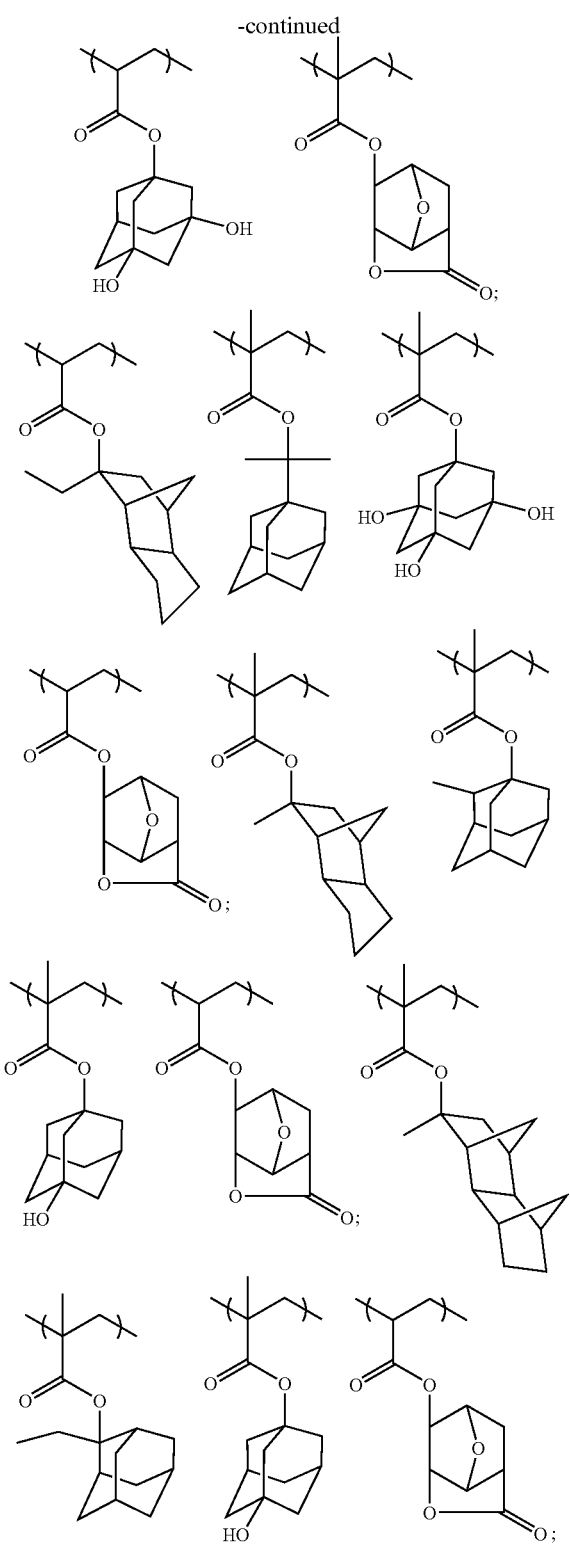

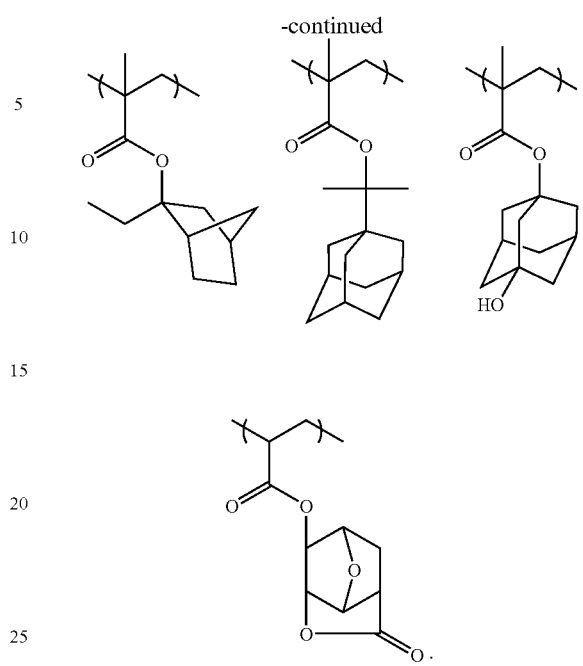

10. The polymer of claim 1 wherein the molar fraction of recurring units of formula 1 is at least 5%.

11. The polymer of claim 1 wherein the molar fraction of recurring units of formula 2 is at least 2%.

12. The polymer of claim 1 wherein the molar fraction of recurring units of formula 3 is at least 5%.

13. The polymer of claim 1 wherein the molar fraction of recurring units of formula 4 is at least 5%.

14. The polymer of claim 1 further comprising recurring units of α,β-unsaturated carboxylic acid esters.

15. The polymer of claim 1 further comprising recurring units of at least one α,β-unsaturated carboxylic acid ester selected from the group consisting of acrylates, methacrylates, crotonates, maleates, itaconates, and mixtures thereof.

16. The polymer of claim 1 further comprising recurring units of at least one member selected from the group consisting of acrylonitrile; methacrylonitrile; α,β-unsaturated lactones; cyclic olefins; norbornene and tetracyclo[4.4.0.1$^{2,5}$.1$^{7,10}$]dodecene.

17. The polymer of claim 1 further comprising recurring units of α,β-unsaturated carboxylic acid anhydrides.

18. The polymer of claim 1 further comprising recurring units of at least one member selected from the group consisting of allyl ethers; vinyl ethers; vinyl esters; and vinyl silanes.

* * * * *

UNITED STATES PATENT AND TRADEMARK OFFICE
CERTIFICATE OF CORRECTION

PATENT NO.         : 7,135,270 B2                         Page 1 of 9
APPLICATION NO.    : 10/911676
DATED              : November 14, 2006
INVENTOR(S)        : Takeru Watanabe et al.

It is certified that error appears in the above-identified patent and that said Letters Patent is hereby corrected as shown below:

Column 13, line 5 to column 17, line 48, should read:

Illustrative, non-limiting examples of the inventive polymers comprising recurring units, each of at least one type, having the general formulae (1) to (4) are given below.

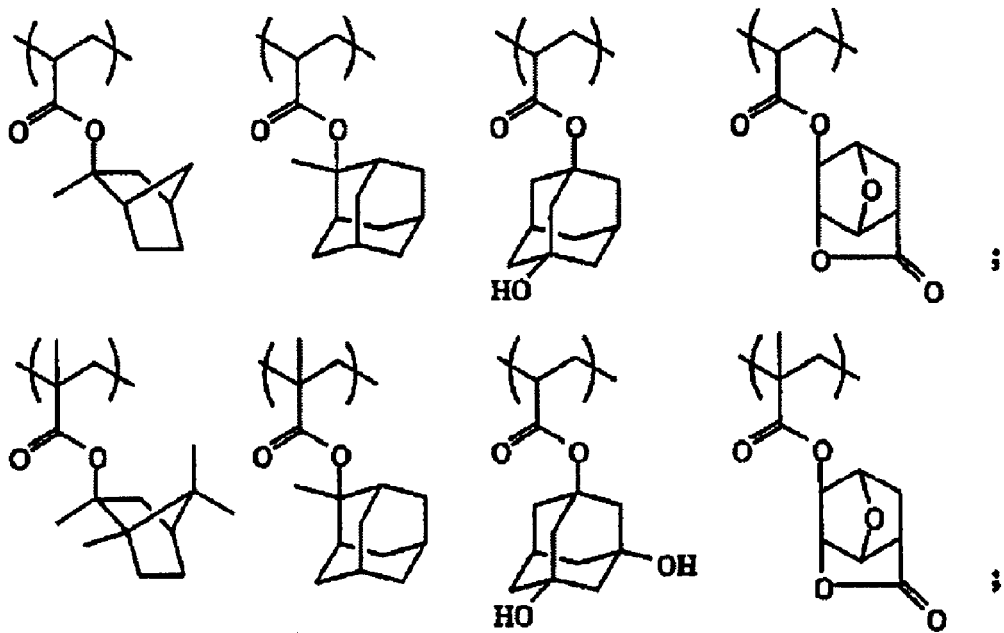

UNITED STATES PATENT AND TRADEMARK OFFICE
CERTIFICATE OF CORRECTION

PATENT NO.        : 7,135,270 B2
APPLICATION NO.   : 10/911676
DATED             : November 14, 2006
INVENTOR(S)       : Takeru Watanabe et al.

It is certified that error appears in the above-identified patent and that said Letters Patent is hereby corrected as shown below:

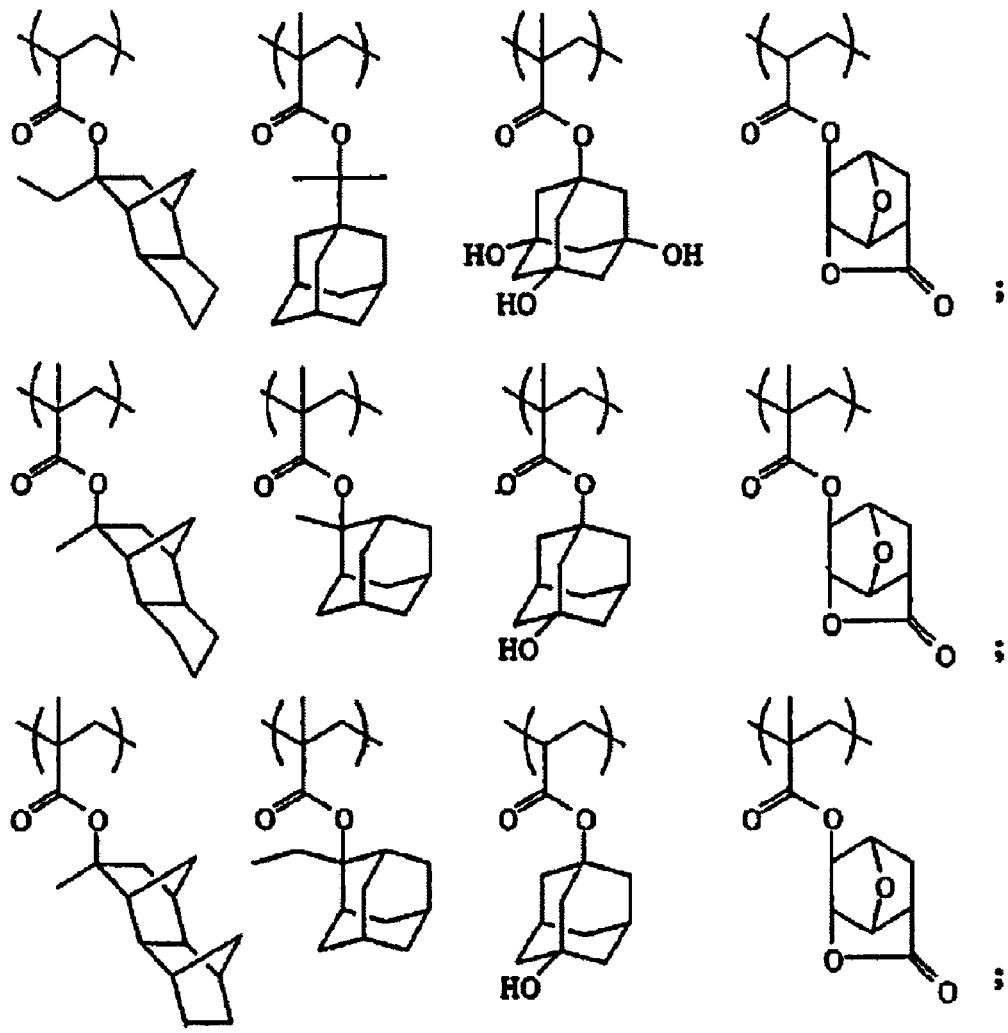

UNITED STATES PATENT AND TRADEMARK OFFICE
CERTIFICATE OF CORRECTION

PATENT NO. : 7,135,270 B2
APPLICATION NO. : 10/911676
DATED : November 14, 2006
INVENTOR(S) : Takeru Watanabe et al.

It is certified that error appears in the above-identified patent and that said Letters Patent is hereby corrected as shown below:

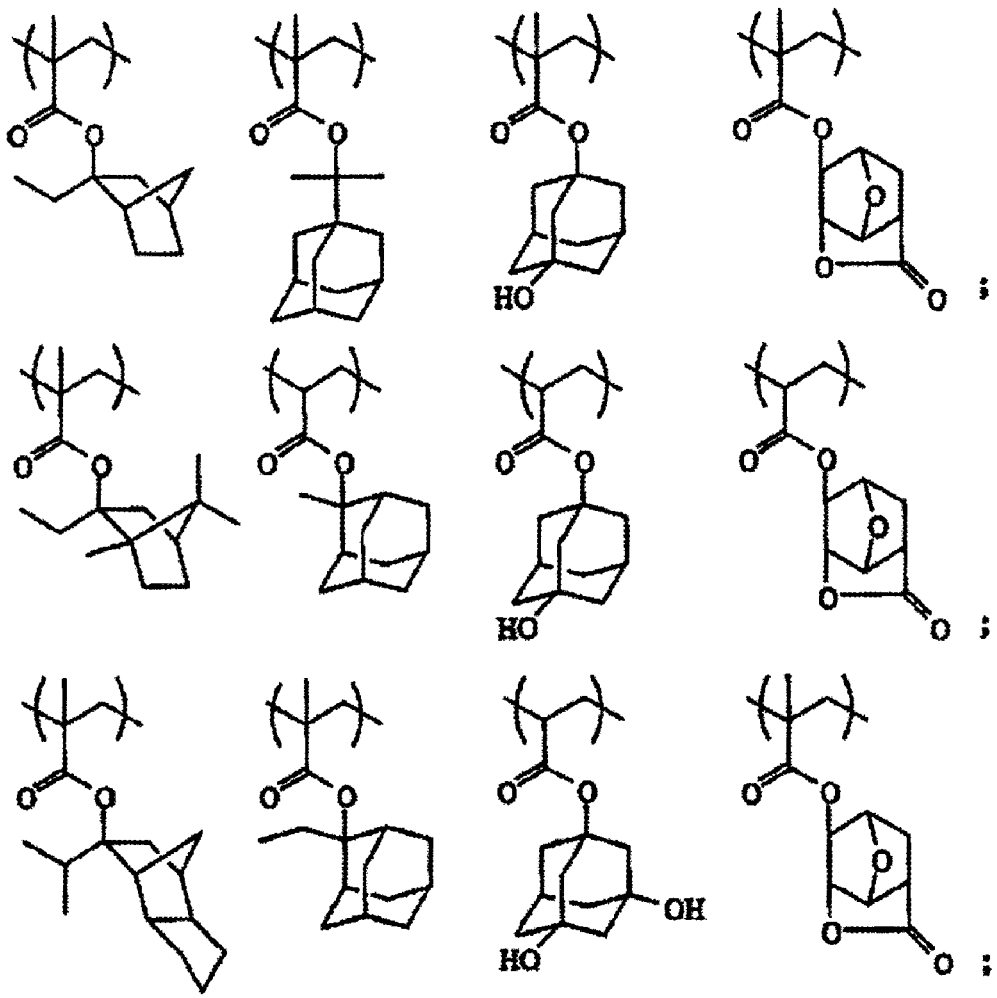

UNITED STATES PATENT AND TRADEMARK OFFICE
CERTIFICATE OF CORRECTION

PATENT NO. : 7,135,270 B2  Page 4 of 9
APPLICATION NO. : 10/911676
DATED : November 14, 2006
INVENTOR(S) : Takeru Watanabe et al.

It is certified that error appears in the above-identified patent and that said Letters Patent is hereby corrected as shown below:

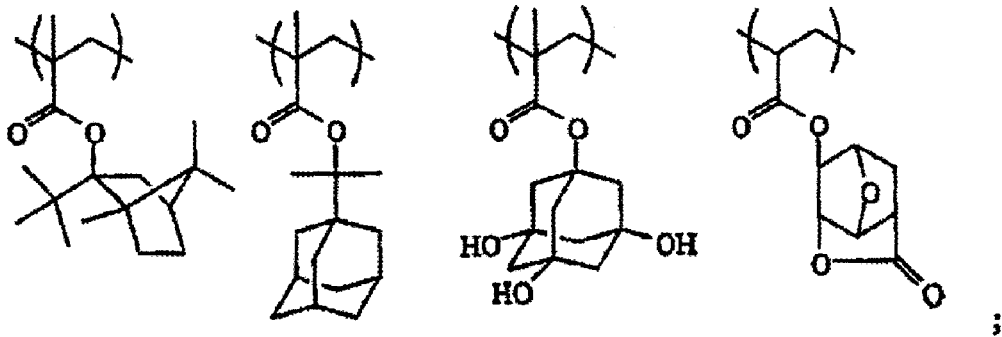

;

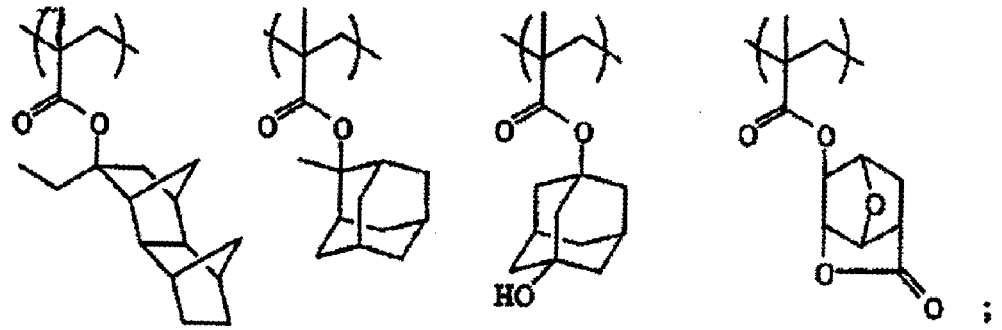

;

UNITED STATES PATENT AND TRADEMARK OFFICE
CERTIFICATE OF CORRECTION

PATENT NO.         : 7,135,270 B2                                    Page 5 of 9
APPLICATION NO. : 10/911676
DATED                 : November 14, 2006
INVENTOR(S)        : Takeru Watanabe et al.

It is certified that error appears in the above-identified patent and that said Letters Patent is hereby corrected as shown below:

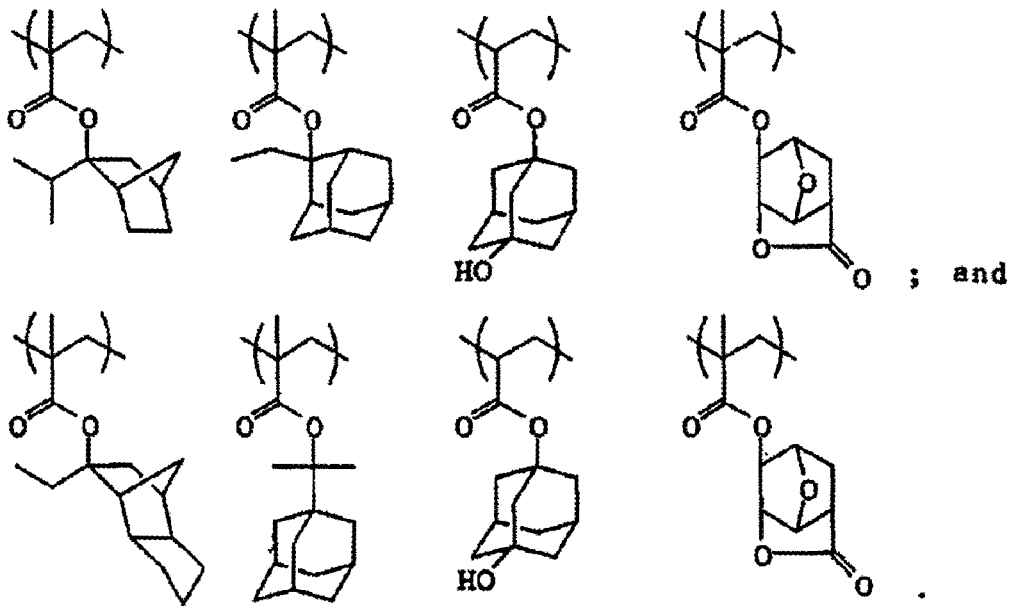

NOTE TO USPTO: The above formulas represent polymers comprising recurring units of formulae (1) to (4). Therefore, if the formulas are split for patent format purposes, semi-colons should be used between each polymer to avoid confusion.

UNITED STATES PATENT AND TRADEMARK OFFICE
CERTIFICATE OF CORRECTION

PATENT NO. : 7,135,270 B2
APPLICATION NO. : 10/911676
DATED : November 14, 2006
INVENTOR(S) : Takeru Watanabe et al.

It is certified that error appears in the above-identified patent and that said Letters Patent is hereby corrected as shown below:

Column 45, line 1 to column 48, line 30, should be replaced with the following:

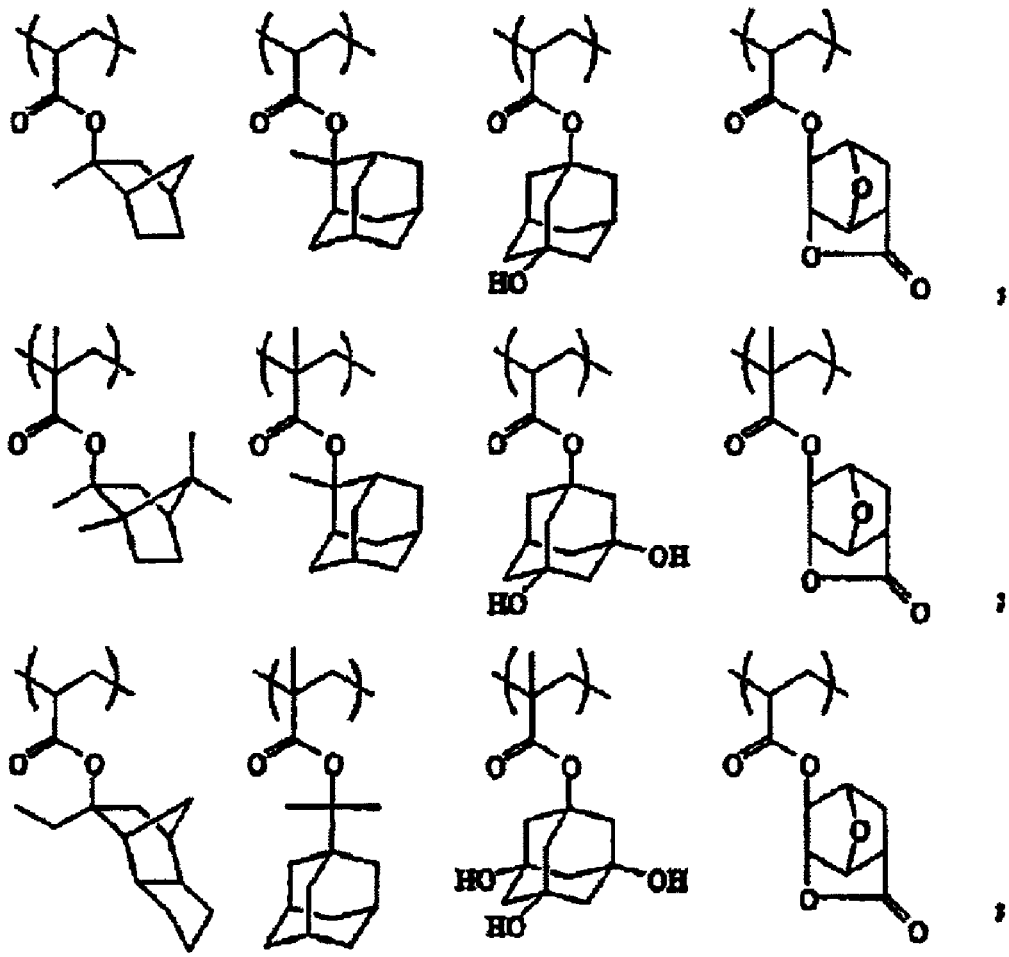

UNITED STATES PATENT AND TRADEMARK OFFICE
CERTIFICATE OF CORRECTION

PATENT NO. : 7,135,270 B2 Page 7 of 9
APPLICATION NO. : 10/911676
DATED : November 14, 2006
INVENTOR(S) : Takeru Watanabe et al.

It is certified that error appears in the above-identified patent and that said Letters Patent is hereby corrected as shown below:

(Con't.) Column 45, line 1 to column 48, line 30, should be replaced with the following:

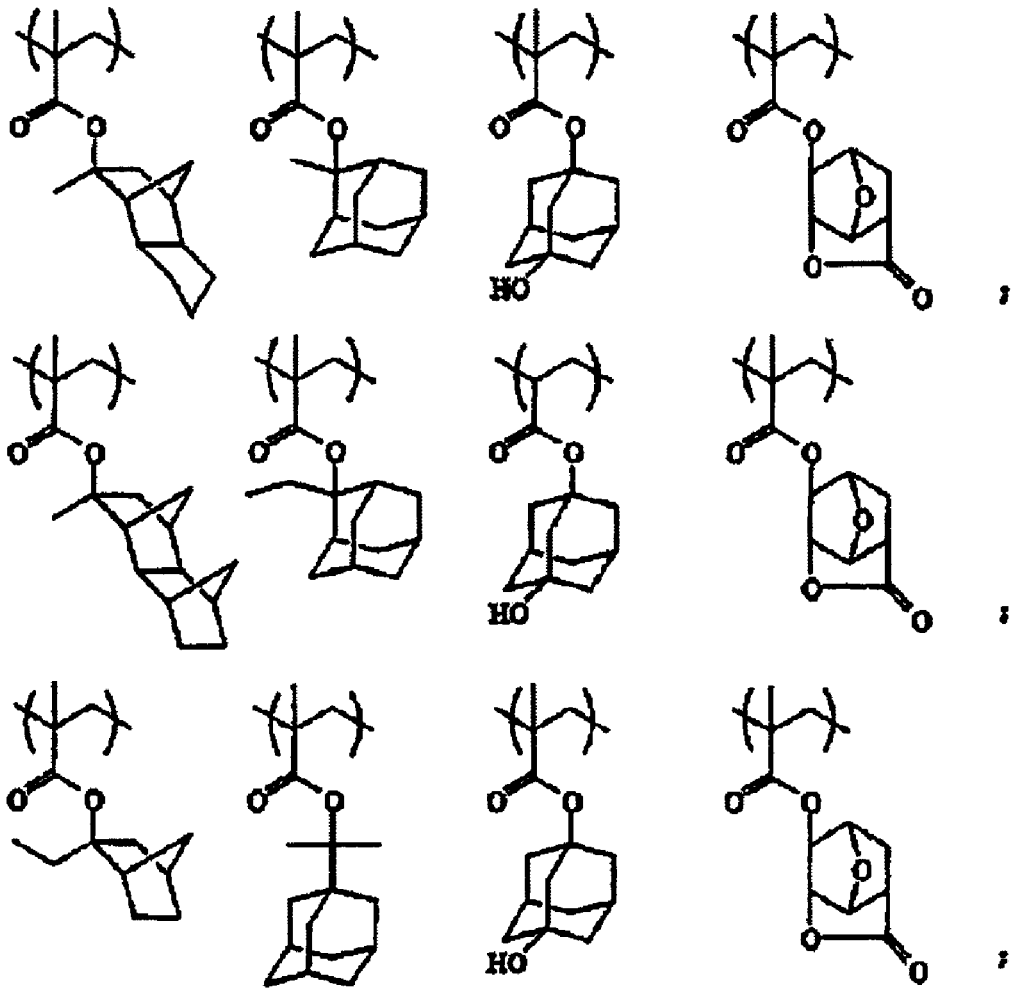

UNITED STATES PATENT AND TRADEMARK OFFICE
CERTIFICATE OF CORRECTION

PATENT NO. : 7,135,270 B2  Page 8 of 9
APPLICATION NO. : 10/911676
DATED : November 14, 2006
INVENTOR(S) : Takeru Watanabe et al.

It is certified that error appears in the above-identified patent and that said Letters Patent is hereby corrected as shown below:

(Con't.) Column 45, line 1 to column 48, line 30, should be replaced with the following:

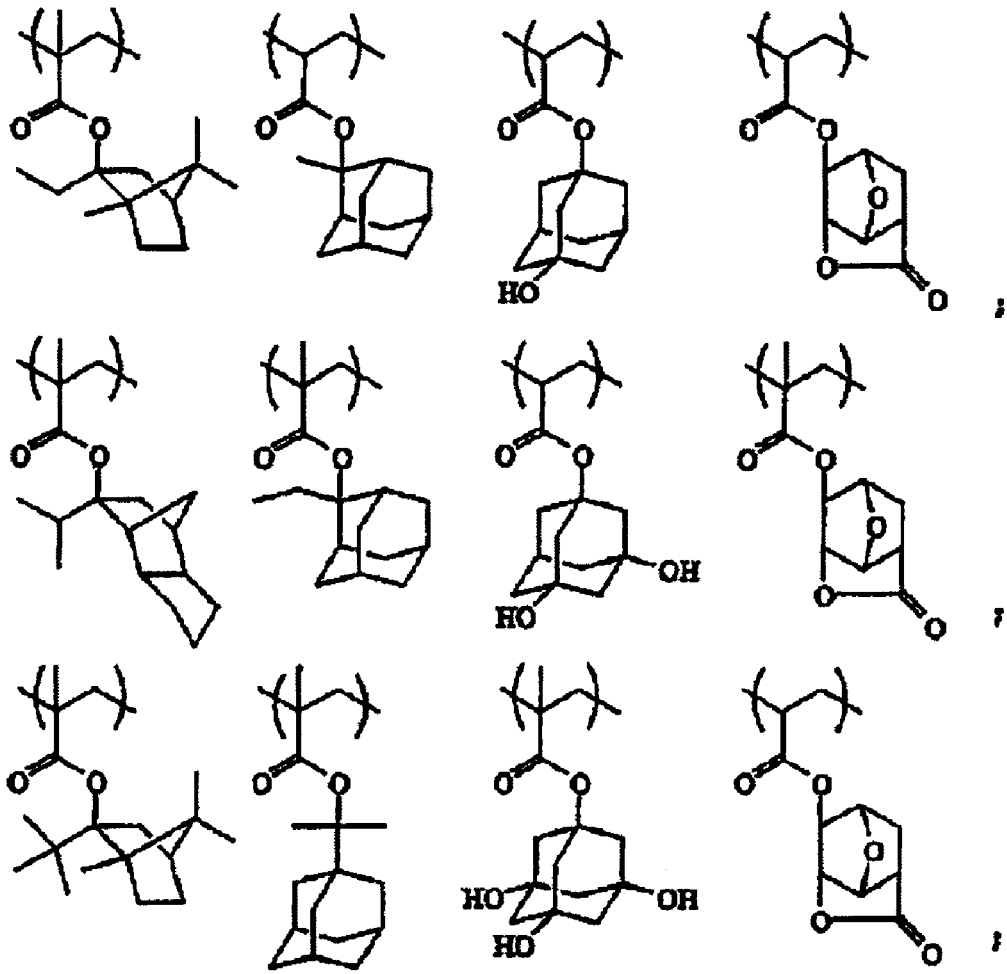

UNITED STATES PATENT AND TRADEMARK OFFICE
CERTIFICATE OF CORRECTION

PATENT NO. : 7,135,270 B2
APPLICATION NO. : 10/911676
DATED : November 14, 2006
INVENTOR(S) : Takeru Watanabe et al.

It is certified that error appears in the above-identified patent and that said Letters Patent is hereby corrected as shown below:

(Con't.) Column 45, line 1 to column 48, line 30, should be replaced with the following:

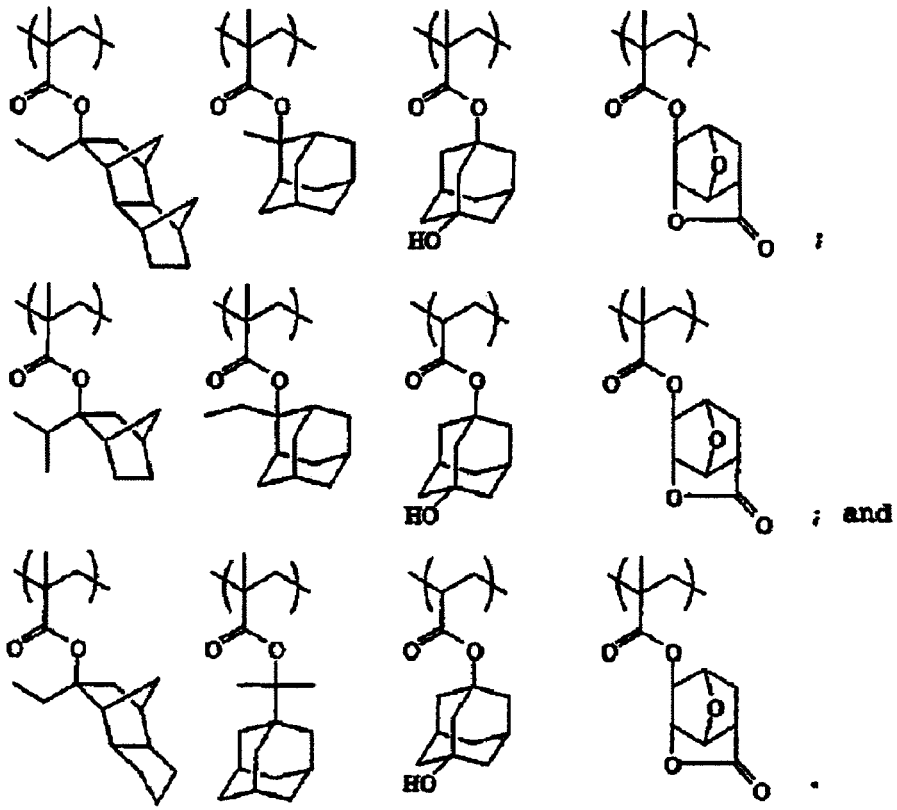

Signed and Sealed this

Twenty-fourth Day of June, 2008

JON W. DUDAS
*Director of the United States Patent and Trademark Office*